United States Patent
Hamsa

(10) Patent No.: US 6,564,201 B1
(45) Date of Patent: May 13, 2003

(54) EXPERT DESIGNER SYSTEM VIRTUAL PLUG-IN INTERFACE

(75) Inventor: Michael B. Hamsa, Cedar Park, TX (US)

(73) Assignee: Cook-Hurlbert, Inc., Austin, TX (US)

( * ) Notice: Subject to any disclaimer, the term of this patent is extended or adjusted under 35 U.S.C. 154(b) by 0 days.

(21) Appl. No.: 09/558,123

(22) Filed: Apr. 25, 2000

(51) Int. Cl.$^7$ .............. G06F 15/00; G09G 5/00
(52) U.S. Cl. ............. 707/1; 345/661; 345/676; 345/700
(58) Field of Search ............ 707/1–2, 100–102, 707/500, 517; 345/594, 595, 650, 661, 700, 676, 738, 762, 773

(56) References Cited

U.S. PATENT DOCUMENTS 5,495,567 A * 2/1996 Iizawa et al. ............... 345/762
5,809,145 A * 9/1998 Silk et al. .................... 705/52
5,812,840 A * 9/1998 Shwartz ....................... 704/7
6,401,230 B1 * 6/2002 Ahanessians et al. ......... 716/1

* cited by examiner

*Primary Examiner*—Alford W. Kindred
(74) *Attorney, Agent, or Firm*—Campbell Stephenson Ascolese LLP; D'Ann Naylor Rifai

(57) ABSTRACT

A virtual plug-in interface for an expert designer system for use with one or more database system types is disclosed. The expert designer system includes a core for performing functions. The virtual plug-in interface interacts with the database system such that the expert designer system core functions independently of the database system type. The database system categories with which the virtual plug-in interface operates include a geographic information system (GIS) and a work management system (WMS). The virtual plug-in interface includes a virtual GIS plug-in interface for a GIS and a virtual WMS plug-in interface for a WMS. The virtual GIS plug-in interface interacts with the GIS such that the expert designer system core functions independently of the GIS database system type. The virtual WMS plug-in interface interacts with the WMS such that the expert designer system core functions independently of the WMS database system type.

16 Claims, 5 Drawing Sheets

EXPERT DESIGNER SYSTEM VIRTUAL PLUG-IN INTERFACE

Portions of this patent application contain materials that are subject to copyright protection. The copyright owner has no objection to the facsimile reproduction by anyone of the patent document, or the patent disclosure, as it appears in the Patent and Trademark Office file or records, but otherwise reserves all copyright rights whatsoever.

APPENDICES

Included are two appendices to this patent application. Appendix A includes Expert Designer System Version 3.0, Virtual GIS, Application Programming Interface (API), Technical Specification, Version 1.0 (Feb. 24, 2000). Appendix B includes Expert Designer System Version 3.0, Virtual WMS, Application Programming Interface (API), Technical Specification, Version 0.2 (Jan. 4, 2000).

BACKGROUND OF THE INVENTION

1. Field of the Invention

The present invention relates to expert designer systems, and more particularly to interfaces for expert designer systems for use in the utility industry.

2. Description of the Related Art

Expert designer systems allow a user to design a real-world facility on the computer and to analyze the resulting computerized model of the facility to enhance or change the design. As described herein, a facility is made up of features, real-world components such as transformers and telephone poles. A feature may be a compound feature containing other features; for example, a switchbox contains and cutouts, each switch and cutout itself being a feature. A facility is designed for a particular work location, defined by physical boundaries of the land.

Expert designer systems automate developing, planning, modeling, and managing large facilities. In the utility industry, expert designer systems are used to manage, for example, gas distribution utility systems and electric utility distribution systems. Expert designer systems often access and make use of geographic information systems (GIS) information. Geographic information systems provide spatial information describing existing land and facilities to be incorporated into proposed designs. For example, an expert designer system may be used to design facilities in coordination with a variety of sources of geographic information, such as Automated Mapping and Facilities Management (AM/FM), Geographic Information Systems (GIS), Supervisory Control and Data Acquisition (SCADA), and related information technologies for utilities, government agencies, and other organizations concerned with land records and facilities management. These geographic information sources will be referred to collectively herein as "geographic information systems," or "GISs."

It is known to provide an expert designer system for use with geographic information systems. One example of such a system is available from Cook-Hurlbert, Inc. under the trade designation CH-Expert Designer, v. 2.0. FIG. 1, labeled prior art, shows a block diagram of such an expert designer system for use with geographic information systems. The expert designer system of FIG. 1 includes an expert designer 102 and an expert designer database 108. Expert designer 102 is coupled to a GIS core 104. The GIS core 104 is coupled to a GIS database 106. In operation, a user accesses the expert designer system 102, which interacts with the GIS core 104 to obtain information from the GIS database 106. The expert designer 102 is designed specifically to interact with a particular GIS.

The expert designer 102 also integrates GIS with work management applications (not shown), offering a standard, cost-effective way to close the loop between design and mapping. Expert designer 102 allows GIS-based spatial information describing existing land and facilities to be incorporated into proposed designs.

The expert designer system of FIG. 1 includes a plurality of analysis tools including an electrical distribution system analysis tool and a gas analysis tool. The electrical distribution system analysis tool helps utilities reduce expensive losses in current systems and design maximum efficiencies into future installations. The gas analysis tool is used for natural gas and other hydraulic systems, giving engineers a complete tool kit for a wide range of network modeling tasks The electrical distribution system analysis tool helps utilities ward off damaging voltage fluctuations in radial electric distribution systems. The software's short-circuit analysis program offers information on what happens in an electric distribution system when a fault occurs. The product also offers graphic user interface independence. CH-Analysis leverages existing technology by using the front and back end of a current GIS, keeping information access under one umbrella. The electrical distribution system analysis tool includes VAR Optimization and Motor Starting, providing a more robust electric analysis package.

The gas analysis tool provides for load flow analysis, pipe sizing, valve coefficient calculation, pressure drop calculation and tail end pressure calculation. The gas analysis tool enhances the GIS to provide maximum benefits. The ability of these tools to link AM/FM/GIS software to analysis tools keeps all information accessible under one umbrella.

The CH-Expert Designer system also includes a quality analysis tool that allows utilities to easily verify connectivity, object placement, and object attribute values in a trail boundary network, or an entire GIS. The quality analysis tool allows users to verify that the data meet very high quality standards and to identify recurring problems.

The expert designer system provides user interfaces to link AM/FM/GIS software to analysis tools. The user interfaces allow users to employ their AM/FM/GISs to create and import analysis data, drive analysis programs and accumulate or reduce network variables.

The expert designer system described above provides excellent tools for modeling and designing facilities. However, the expert designer systems described above are designed to interact with a specific GIS and/or work management system. Most expert designer systems cannot be adapted to operate with more than one type of GIS or more than one type of work management system. What is needed is an expert designer system that operates independently of the type of GIS and the type of work management system.

SUMMARY OF THE INVENTION

In accordance with the present invention, an expert designer system for managing facility designs and work requests is presented. The expert designer system includes an expert designer system core to request information from database systems. The expert designer system also includes a virtual plug-in interface that enables the expert designer system to seamlessly integrate with multiple types of database systems, including geographic information systems and work management systems.

The virtual plug-in interface may include a virtual GIS plug-in interface which communicates with the expert designer system core and with a geographic information system. The virtual plug-in interface may include a virtual WMS plug-in interface which communicates with the expert designer system core and with a work management system. The expert designer system operates independently of the type of geographic information system and the type of work management system. The expert designer system includes a plurality of functions including design process management, offline design, configurable rule based feature placement and quality control, configurable rule based unit assignment, design editing tools, and structural, electrical and gas analysis.

The virtual GIS plug-in interface includes at least one of the following interfaces: a GIS modeling interface, a GIS database interface, a GIS workspace interface, a GIS events interface, a GIS topology interface, a GIS active view interface, and a GIS plot interface.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Overview

Figure 1:
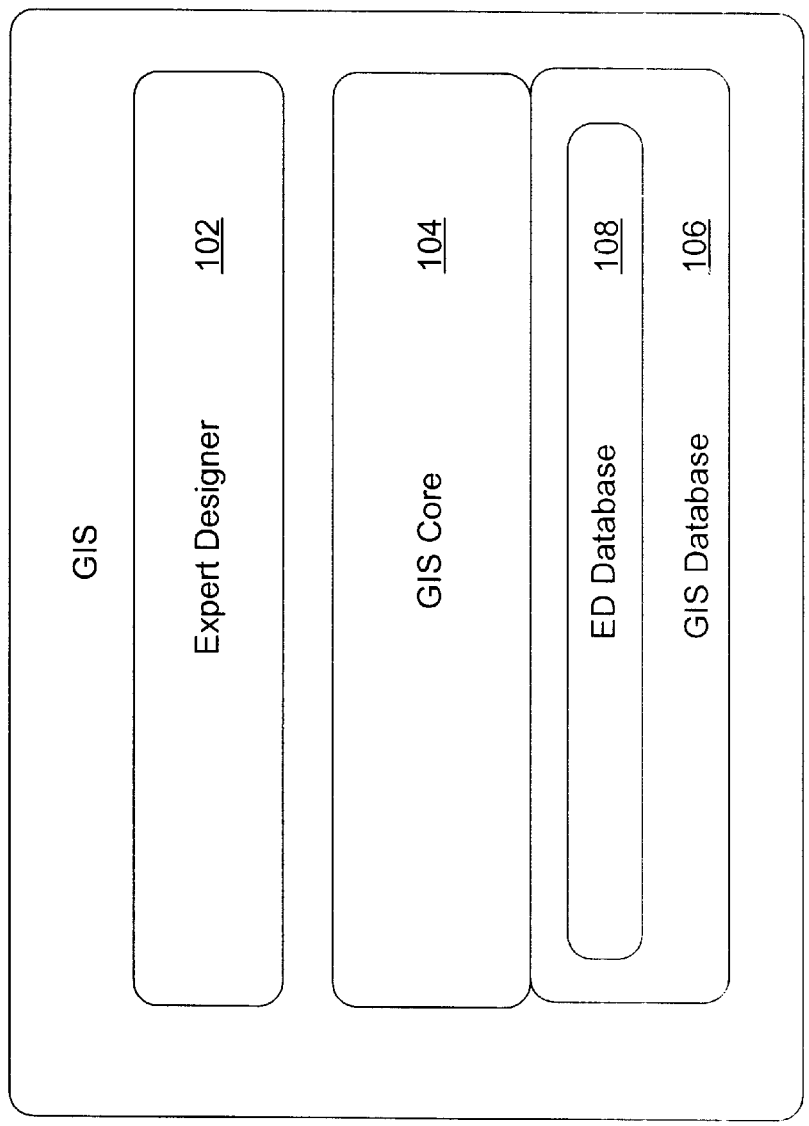
FIG. 1 shows a block diagram of a prior art expert designer system and a geographic information system.
Figure 2:
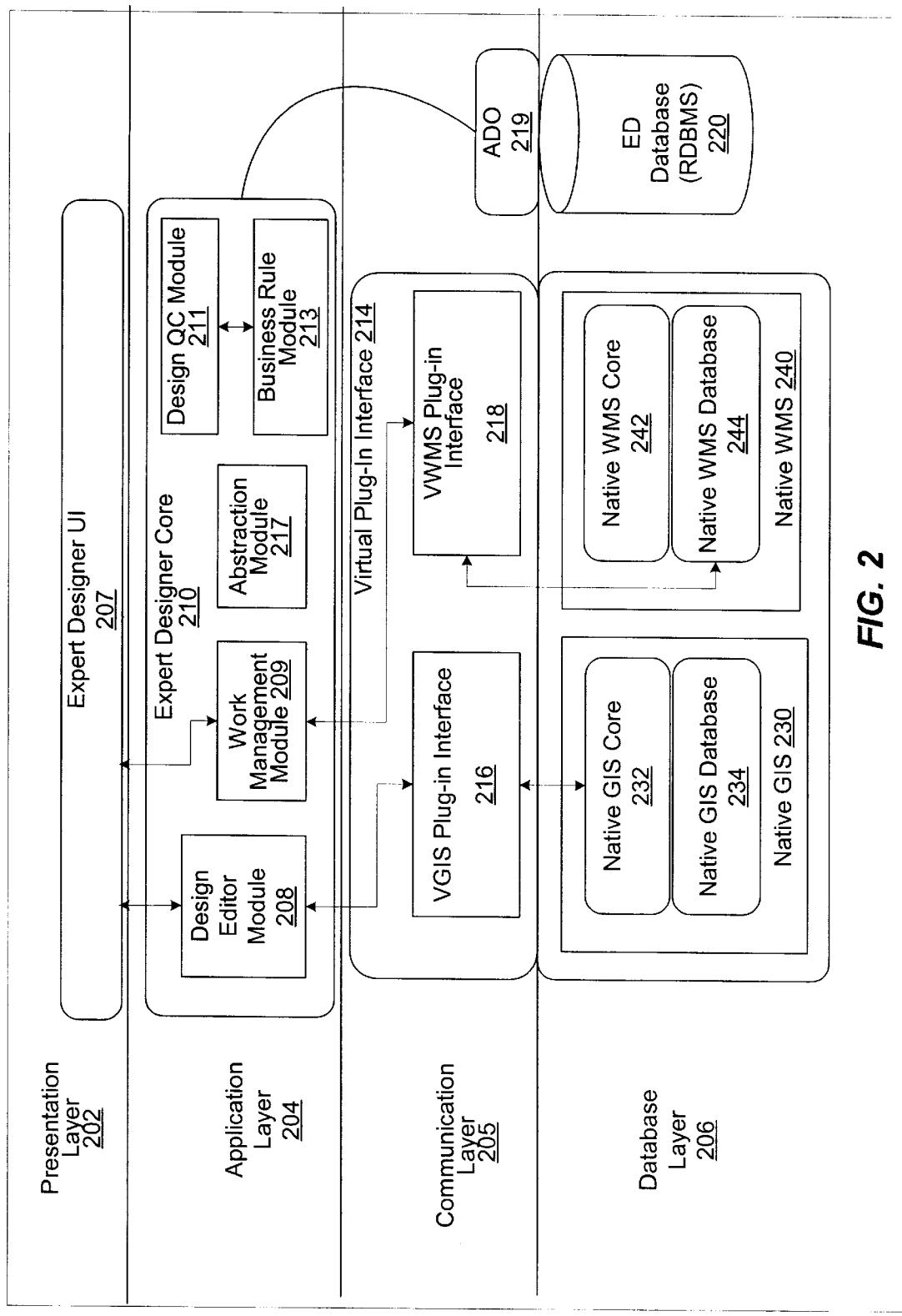
FIG. 2 shows a block diagram of an expert designer system in accordance with the present invention, a geographic information system, and a work management system.

FIG. 2 shows a block diagram of an expert designer system 200 and a geographic information system and a work management system with which the expert designer system interacts. Expert designer system 200 includes expert designer user interface 207, expert designer core 210, ADO (ActiveX Data Objects) 219, and ED Database (RDBMS) 220. The expert designer system 200 includes a presentation layer 202, an application layer 204, a communications layer 205, and a database layer 206. Presentation layer 202 includes an expert designer user interface 207.

Application layer 204 includes an expert designer core 210 which includes at least one module such as design editor module 208, work management module 209, design QC module 211, and business rules module 213.

Communications layer 205 includes a virtual plug-in interface 214 and ActiveX Data Objects (ADO) 219. Virtual plug-in interface 214 includes a virtual geographic information system (GIS) interface 216 and a virtual work management system (WMS) interface 218. Design editor module 208 makes all calls to virtual GIS plug-in interface 216 and work management module 209 makes all calls to virtual WMS plug-in interface 218.

Database layer 206 includes an expert designer system (ED) database 220 for storing persistent data for the expert designer system 200. ED database 220 is preferably implemented using a relational database management system, although databases implemented using non-relational database management systems are also within the scope of the invention. Also shown at the database layer 206 level, although not a part of the expert designer system 200, are two types of database systems with which the expert designer system 200 is designed to interact: a native geographic information system (GIS) 230, including a native GIS core 232 and a native GIS database 234, and a native work management system (WMS) 240, including a native WMS core 242 and a native WMS database 244.

In operation, the expert designer user interface 210 interacts with the expert designer core 212. The expert designer core 212 is coupled to the database layer 206 via the virtual plug-in interface 214. The expert designer core 212 is also coupled to the ED database 220 via ADO 219.

The expert designer core 212 performs a plurality of functions. More specifically, the expert designer core 212 exposes common data to the expert designer user interface 207, interacts with the virtual plug-in interface 214, abstracts features in the GIS and/or WMS, contains a knowledge of business rules, and performs expert designer core logic functions.

Examples of common data which may be shared between the expert designer system 200, the GIS, and the WMS include designs, work requests, work locations, work location facilities, compatible units, material items, cost, and associated labor. A compatible unit is a standardized specification of labor and material including material items. For example, in an embodiment for a gas distribution facility, the three systems share information about the design of the gas distribution facility, work requests for changes to the gas distribution facility, the work location of the gas distribution facility, any components of the gas distribution facility already in place at the work location, compatible units, and material items.

When abstracting features in the GIS, expert designer core 210 may use configurable abstraction modules 217 to abstract the shape of tables in the GIS, store database relationship information or contain attribute defaults for feature creation.

The expert designer core 210 also includes a design QC module 211 and a business rules engine 213. Business rules engine 213 defines feature placement rules and stores quality assurance/quality control (QA/QC) information. More specifically, the feature placement rules handle attribute dependencies, manage device aggregation and restrict incorrect feature placement. Design QC module 211 is used to ensure that a design meets quality standards for feature connectivity and attributes.

Figure 3:
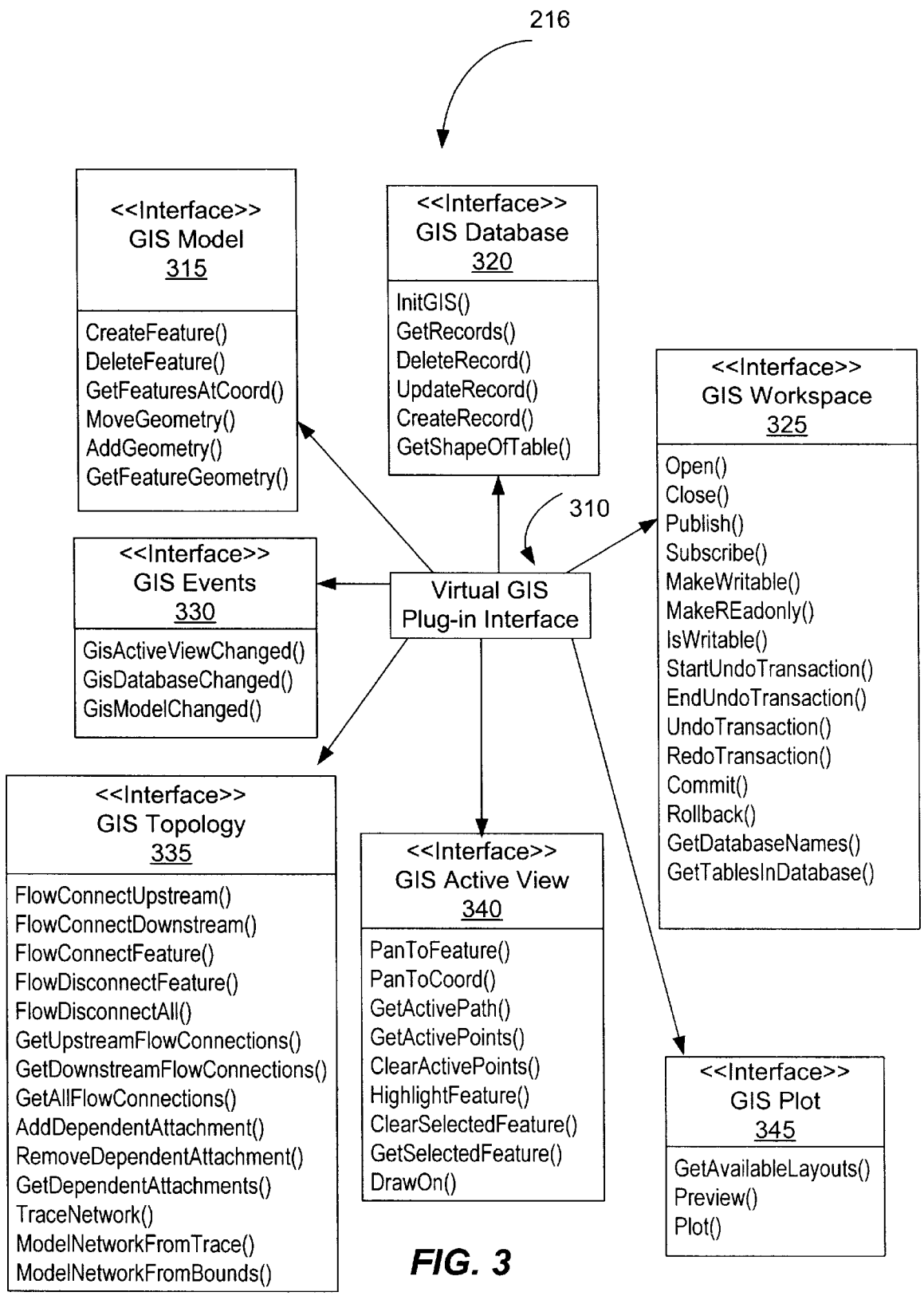
FIG. 3 shows an example of an object model of the virtual geographic information system interface of the expert designer system of FIG. 2.

FIG. 3 is an object model of virtual GIS plug-in interface 216. The expert designer system of FIG. 3 is based upon a Component Object Model (COM) architecture. The COM architecture is an open architecture which provides the expert designer system with independence from specific GIS and WMS implementations and specific programming languages. Other embodiments of the expert designer system may use other architectures that provide independence similar to that provided by the COM architecture.

For those unfamiliar with object-oriented frameworks, a brief summary is presented here. The building block of an object-oriented framework is an object. An object is defined through its state and a behavior. The state of an object is set forth via properties of the object, which are included as fields in the object. The behavior of the object is set forth by methods of the object. Each object is an instance of a class, which provides a template for the object. A class defines zero or more fields to store properties of an object and zero or more methods.

Each field is a data structure that contains property information defining a portion of the state of an object. Objects that are instances of the same class having the same fields, but where the particular property information contained within the fields may vary from object to object. Each field can contain information that is direct, such as an integer value, or indirect, such as a reference to another object.

A method is a collection of computer instructions that execute in a processor using computer system software. The instructions of a method are executed and the method is performed when software requests that the object for which the method is defined perform the method. The object performing the method is the responder or the responding object. When performing the method, the responder consumes one or more arguments, i.e., input data and produces zero or one result, i.e. an object returned as output data. The methods for a particular object define the behavior of the object. When a method of an object is called, the method that is accessed may be defined in a class of which the object is a member or in any one of super-classes of the class of which the object is a member.

Interfaces are modeled as objects in the expert designer system described herein. An interface is implemented by writing function calls, or modules, of a computer program. As used herein, modules are equivalent to methods to communicate with a database system such as a geographic information system or a work management system.

Returning to the invention, the virtual GIS COM model for the embodiment of the expert designer system 200 shown in FIG. 3 includes three co-classes, one class for accessing the native GIS 230 and two classes for plotting GIS information. The virtual GIS plug-in interface 216 exposes seven interfaces. The virtual GIS plug-in interface 216 is implemented differently for each native GIS 230, and each implementation has a unique identifier. The identifier for the virtual GIS plug-in interface 216 is stored in the registry and accessed by the expert designer system 200 upon initialization. The interfaces exposed by the virtual GIS plug-in interface 216 co-classes are identified using an interface identifier. Each interface identifier is the same for all implementations for the virtual plug-in interface 216. These interfaces are discussed in more detail below.

Virtual GIS plug-in interface 216 is a collection of services intended to provide isolation from specific GIS implementations. In the embodiment shown in FIG. 3, the services are provided as a set of Component Object Model (COM) interfaces. GIS model interface 315 provides a limited set of operations focused on the creation and maintenance of GIS features that contain graphics. GIS active view interface 340 provides a limited set of services to control and query the user's view of the GIS map. Services include panning the map to specific map locations, query of the user's tap points, and query and control of the user's selected features. GIS database interface 320 provides basic operations on records in the native GIS database 234. GIS topology interface 335 provides both connection and attachment capabilities for features in the GIS. GIS workspace interface 325 provides the capability to manage the workspace of GIS model data. A workspace corresponds to the user's current working session within native GIS 230. The GIS workspace interface 325 provides management of that workspace including creation, deletion, and merging different users' workspace to allow different users to make simultaneous changes to the same geographic map. GIS plot interface 345 provides the capability to plot images from the GIS. Each of these interfaces uses geometries and is described in more detail below.

The GIS model interface 315 controls feature manipulation including feature addition, feature update, feature movement, feature deletion and feature retrieval. A feature represents a real-world object which cannot be further divided into similar objects, such as a pole or a street. A feature includes the real world object's cartographic geometries and database elements (e.g., attributes).

In the embodiment shown in FIG. 3, the GIS modeling interface 315 exposes the methods that act upon objects in a single COM interface.

The GIS modeling interface 315 uses several objects exposed as a geometry. A geometry identifies spatial data used to create graphical elements. A geometry is one of the following objects: an ILine object which includes a collection of coordinates made of line segments, arc segments, and bspline segments; an IText object including a coordinate along with a string buffer, orientation, and justification; or an IPoint object including a coordinate, orientation, and scale. The ILine, IPoint, and IText objects all implement IGeometry, and the ILine, IPoint, and IText objects are passed to the virtual GIS plug-in interface 216.

A feature object consists of a geometry and a database record. A compound feature object is a collection of features in a containment relationship. The container (or parent object) has a database record and a geometry. The child features do not have geometry.

The GIS database interface 320 controls standard database manipulation. More specifically, the GIS database interface 320 includes modules for connecting to the native GIS, inserting records, updating records, deleting records, and retrieving records from the native GIS database. The GIS database interface 320 also includes a module for obtaining the shape of a table in the native GIS database 234.

The workspace interface 325 controls the GIS workspace environment. More specifically, the workspace interface controls subscribe/publish functions, open/close functions, undo/redo functions, start transaction/end transaction functions and commit/rollback functions.

The GIS events interface 330 detects and notifies other components of the expert designer system 200 that an event has taken place. Events that are detected by the GIS events interface 330 include a change in one or more of the following: a component of the active view, the native GIS database 234, and a component of the GIS model.

The GIS topology interface 335 establishes two types of connectivity to the native GIS. The first type is a direct GIS connection, where the GIS views and stores the features as connected. The second type of connectivity is an attachment, where additional features or tables are added to a native GIS database (utility schema) to form associations between facilities (such as a structure to device attachment or a structure to conductor attachment). These two types of connectivity allow a feature to connect to another feature and to be attached (but not connected) to another feature.

A GIS connection is established using the virtual GIS plug-in interface by calling GIS connection primitives when needed. Expert designer system 200 also provides the opportunity to customize functionality so that attachments can be included in a design.

The active view interface 340 controls standard GIS view manipulation. The active view interface 340 evaluates the active set of user defined points and creates a geometry object to represent them. If a single point is placed, then a point geometry will be returned. If a series of points have been defined in the GIS, then a line type geometry will be returned, including arcs and curves.

More specifically, the active view interface 340 controls the following functions: retrieve/clear user-defined points, retrieve/clear user-selected features, highlight/remove highlight, pan to coordinate, pan to feature, pan to geometry, draw on, and offset path along feature.

GIS plot interface 345 is discussed in further detail below.

Figure 4:
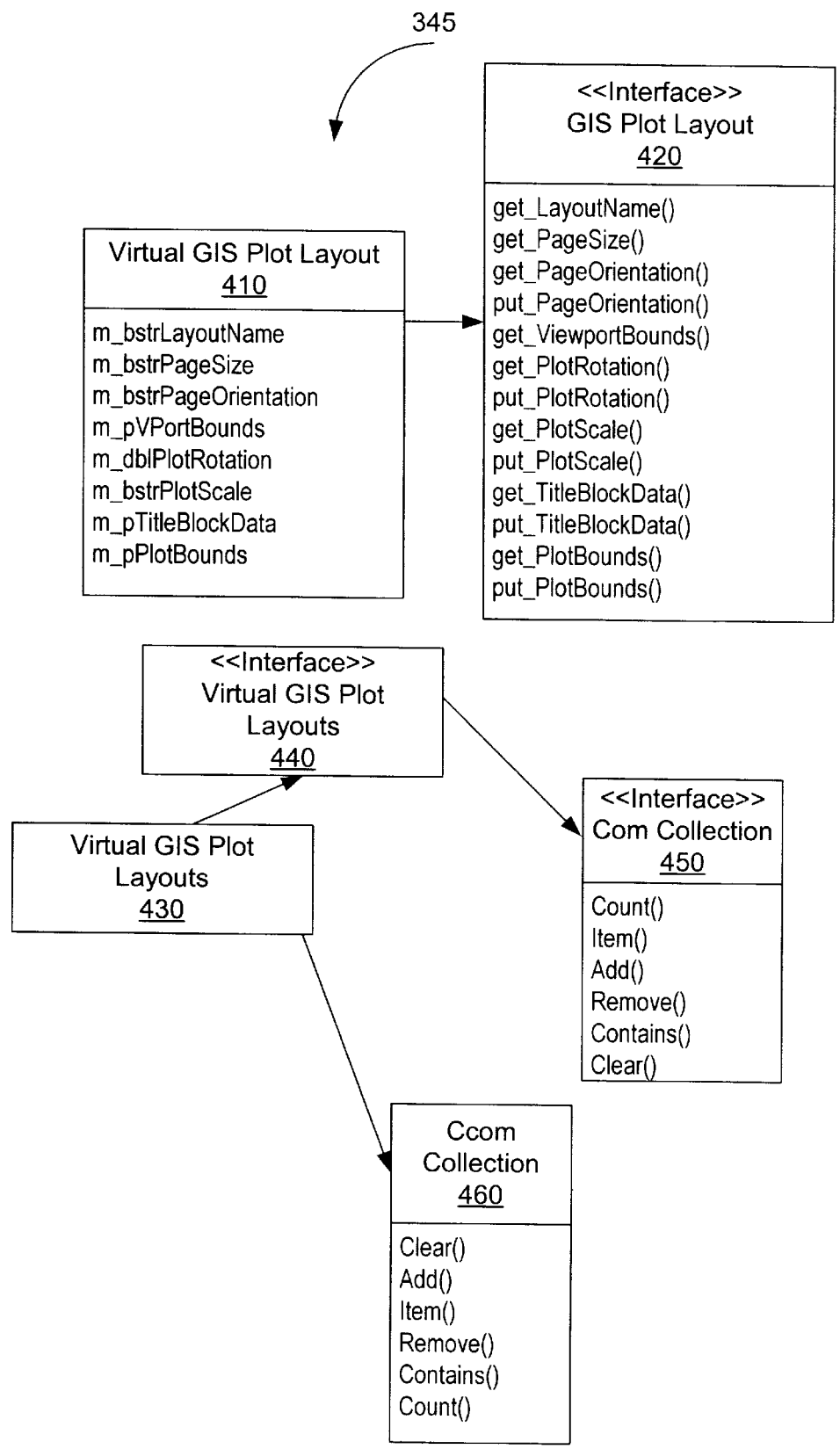
FIG. 4 shows an example of an object model of the GIS plot interface of FIG. 3.

FIG. 4 shows an object model of the GIS plot interface 345. The GIS plot interface 345 includes two co-classes for plotting GIS information, virtual GIS plot layout co-class 410 and virtual GIS plot layouts co-class 430. The GIS plot layout interface 420 is retrieved from the native GIS through the GIS plot interface 345 contained in a virtual GIS plot layouts 430 collection.

Figure 5:
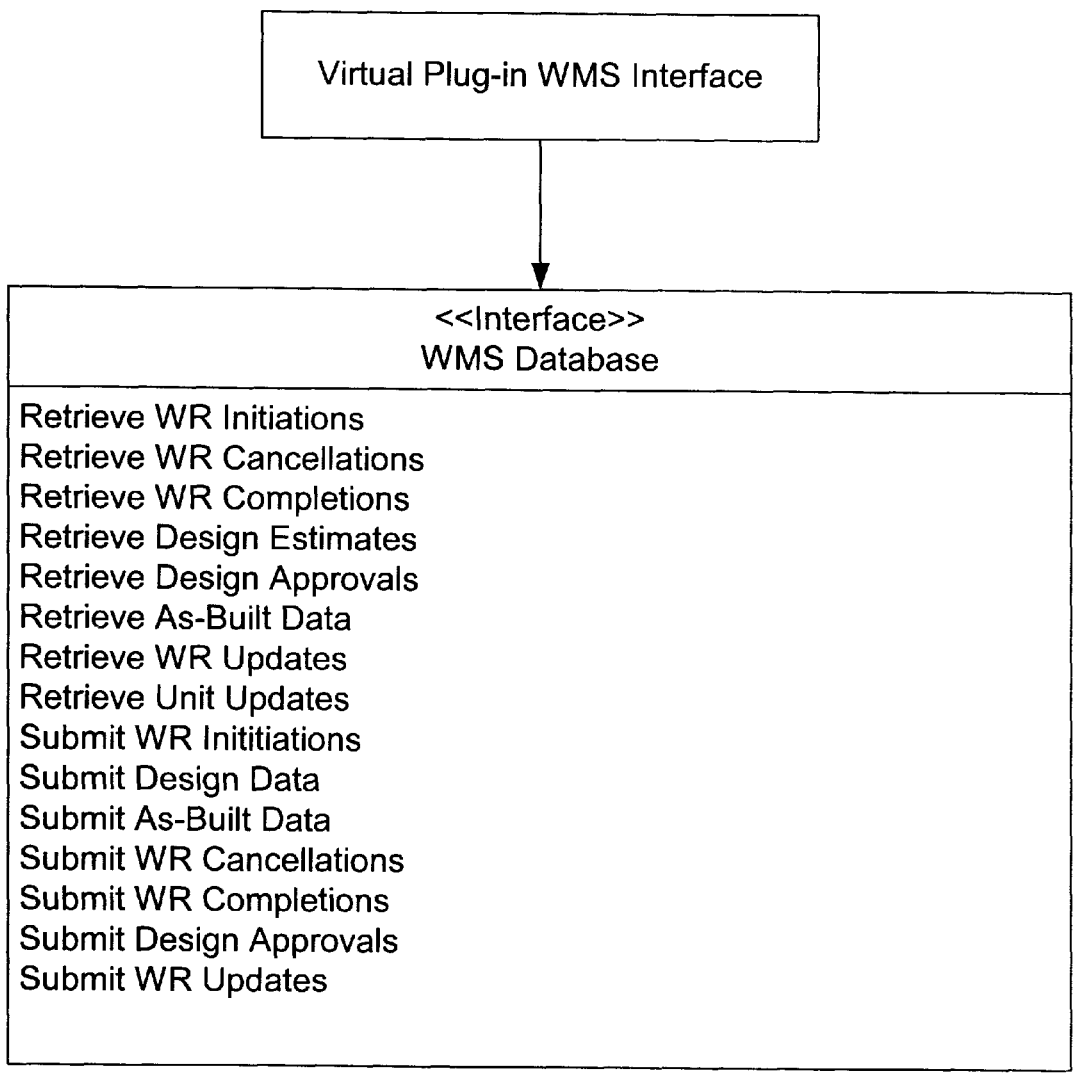
FIG. 5 shows an example of a virtual work management system interface.

FIG. 5 shows an interface for the virtual work management system 510. The interface includes modules to retrieve a work request initiation from the WMS, retrieve work request cancellations, retrieve work request completions, retrieve design estimates, retrieve design approvals, retrieve as-built data, retrieve work request updates, retrieve unit updates, submit work request initiations, submit design data, submit as-built data, submit work request cancellations, submit work request completions, submit design approvals, and submit work request updates.

Other Embodiments

Other embodiments are within the following claims.

APPENDIX A

Expert Designer

Version 3.0

*VIRTUAL GIS*

APPLICATION PROGRAMMING INTERFACE (API)
Version 1.0

*FEBRUARY 24, 2000*

*A technical specification for software implementation.*

1.0 INTRODUCTION

1.1 Purpose and Scope

Specify the detailed programming interface for the Virtual GIS (VGIS) layer. Includes the identification of all COM interfaces and services, complete with typed parameter information and function prototypes for each service

1.2 Functional Overview

Virtual GIS is a collection of services intended to provide isolation form specific GIS implementations. The services are provided as a set of COM interfaces:

- GIS Model Interface
  Provides a limited set of operations focused on the creation and maintenance of GIS features that contain graphics.
- GIS Active View Interface
  Provides a limited set of services to control and query the user's view of the GIS map. Services include panning the map to specific map locations, query of the user's tap points, and query and control of the user's selected features.
- GIS Database Interface
  Provides basic operations on records in the GIS database.
- GIS Topology Interface
  Provides both connection and attachment capabilities for features in the GIS
- GIS Workspace Interface
  Provides the capability to manage the workspace of GIS model data.
- GIS Plot Interface
  Provides the capability to plot images from the GIS.

1.3 Definition Status

I started with the API specification that was used for GITA '99 and added the function prototypes and tables for parameter datatypes and definitions. There were also several instances where the definition was out of date so corrections were made in this regard.

- All interface definitions started and most are complete. A change to the overall syntax has been identified and will be implemented in the future - the use of recordsets instead of CHFieldValueCollColl to pass data to and from the VGIS.

1.4 Issues

1.5 References

- Geometry Component Interface Specification
- Network Component Interface Specification

2.0 DATA MODEL

Currently no data model exists for the virtual GIS

3.0 OBJECT MODEL

The VGIS COM model consists of three coclasses, CHVGIS and CHVGISPlotLayout and CHVGISPlotLayouts. CHVGIS exposes 7 interfaces and CHVGISPlotLayout only exposes a single interface. The interface exposed by CHVGISPlotLayout is not creatable and must be retrieved from the GIS through the ICHGISPlot Interface using ICHVGISPlotLayouts. Because of the way the VGIS is created, each GIS will implement the interfaces of the VGIS differently and will have a unique GUID. The GUID for the VGIS coclass will be stored in the registry and accessed by Expert Designer upon initialization. The interfaces exposed by the VGIS coclasses should all be identified using the same GUID. These GUIDs are as follows.

ICHVGISModel - 527D220E-E39D-11d2-9E8F-00C04F72C51F

ICHVGISActiveView - 2AFEE10A-D405-11D2-9E89-00C04F72C51F

ICHVGISDatabase - 96E2DEF8-E3BF-11d2-9E8F-00C04F72C51F

ICHVGISTopology - 77DC9376-74F8-11D3-8C2B-00008630C59A

ICHVGISWorkSpace - 8D7A0C95-65F0-11D3-8C1A-00008630C59A

ICHVGISPlot - 18566534-DD7F-11D3-8CC3-00008630C59A

_ICHGISEvents - E9B9AE72-3082-11D3-8BD6-00008630C59A

PASSING FEATURE DEFINITIONS

3.1 Identifying Unique Features

Several of the methods defined on the VGIS require a definition to be included that identifies a unique feature. The difficulty with passing this type of definition is not knowing the key field makeup of the feature's table and how it is uniquely identified, as well as a difficulty identifying which database it is located in (in the case of a GIS using several different databases to store information). For this reason, a "Feature Definition Structure" had to be adopted that can be used to pass feature specific information to the VGIS that in turn can be used to uniquely identify a feature.

The Feature Definition Structure is created using an ADO Recordset that takes the following shape.

| Field Name | Field Type | Field Value |
|---|---|---|
| DatabaseName | adVarChar | <feature database name> |
| TableName | adVarChar | <feature table name> |
| KeyFields | adInteger | <number of key fields> |
| Field*Name | adVarChar | <key field name> |
| Field*Operator | adVarChar | "=", "<>", "<", "<=", ">", ">=" |
| Field*Value | adVariant | <key field value> |
| Field*LogicalOperator | adVarChar | "and", "or", "END" |

The DatabaseName column is used to identify the database that the feature can be selected from and the TableName column identifies its table. The following columns will be used to define the key field makeup of the feature and their values so the feature can be selected from the GIS database. KeyFields indicates the number of fields being used to identify the feature, and should correspond to the number of field definitions that follow. The actual definition of the field and its value specification takes place in a series of four columns, **Field*Name, Field*Operator, Field*Value, Field*LogicalOperator** where * should be replaced with an ordered number (1, 2, 3, 4, ...). If multiple key fields are specified, the logical operator should be set to "and" or "or" to indicate how to evaluate the multiple key field definitions. After the last field is identified, set its logical operator to "END" to close the statement off.

- **Field*Name** supplies the name of the key field.

- **Field*Operator** (usually passed as "=") identifies what operator to use when comparing the supplied value to the feature's actual field value.

- **Field*Value** supplies the value to be used in comparison. This value is passed in the form of a VARIANT and should be typed according to the actual type of the key field it is supplied for. The VGIS uses the VARIANT's vt member to correctly create the select statement.

- **Field*LogicalOperator tells the VGIS how to string multiple key field definitions together. Use "and" or "or" as needed and the key fields will be strung together using the supplied logical operators and evaluated from left to right. The Logical Operator for the last field definition should be set to "END"**.

| DatabaseName | "electric" |
|---|---|
| TableName | "pole" |
| KeyFields | 1 |
| Field1Name | "id" |
| Field1Operator | "=" |
| Field1Value | 1234 |
| Field1LogicalOperator | "END" |

Remember that Field1Value is a variant typed as VT_I4 to correspond to the field type of the pole table. This Feature Definition could specify the following SQL statement:

*SELECT * FROM pole WHERE id = 1234*

The Feature Definition Structure Recordset can be supplied to the VGIS with more field definition columns then are actually specified. This can be used to supply different feature type definitions to the VGIS in the same Feature Definition Structure. For example, you may be specifying two different feature types (*say an instance of feature type A with two key fields and an instance of feature type B with one key field*) to the VGIS that do not have the same number of key fields. Simply determine which feature has more key fields, create your recordset with as many field definition combinations, and fill them appropriately. Remember to set the KeyFields column correctly, and to use the "END" logical operator after the last field definition.

3.2 Specifying Trace Stop Criteria

The Feature Definition Structure can also be used to supply stopping criteria for a network trace. Use the same semantics as describe in section 2.1 to add trace stop criteria. For instance, criteria needs to be identified to stop the trace at all Open Switch locations OR Switch Locations that are Proposed Install. Use the following Feature Definition Structure to specific these criteria.

| | |
|---|---|
| DatabaseName | "electric" |
| TableName | "cutout" |
| KeyFields | 2 |
| Field1Name | "status" |
| Field1Operator | "=" |
| Field1Value | "Normally Open" |
| Field1LogicalOperator | "or" |
| Field2Name | "life_cycle_status" |
| Field2Operator | "=" |
| Field2Value | "Proposed Install" |
| Field2LogicalOperator | "END" |

Remember that the actual field values are supplied in VARIANT form, typed to correspond to actual field types of the feature in the GIS. Both of these fields are supplied where variant.vt = VT_BSTR.

3.3 Selecting Records

The Feature Definition Structure will also be used when selecting records from the GIS. Say you want to select all poles from the GIS that are class 3 or class 5. The following Feature Definition Structure can be setup to query the GIS.

| DatabaseName | "electric" |
|---|---|
| TableName | "pole" |
| KeyFields | 2 |
| Field1Name | "class" |
| Field1Operator | "=" |
| Field1Value | "3" |
| Field1LogicalOperator | "or" |
| Field2Name | "class" |
| Field2Operator | "=" |
| Field2Value | "5" |
| Field2LogicalOperator | "END" |

Note that the Field Values are both in VARIANT form typed as VT_BSTR. This Feature Definition Structure could specify the following SQL statement:

*SELECT * FROM pole WHERE class = "3" OR class = "5"*

3.4 Returning Feature Definitions

The Feature Definition Structure will also be used to return information from the VGIS. At this point, only the database name, table name, and the key field definitions are returned. Reasons for this are performance related, and the lack of ability to return a heterogeneous set of features using a single collection. Several methods defined on the VGIS need the ability to return a single collection that include several different types of features (like GetFeatureAtCoord). If any additional information is needed about the feature, an additional call to GetRecords, with the feature definition will need to be issued. The result of this method is a homogenous set of records, in this case one record, if the key fields are defined correctly.

4.0 ICHGISMODEL INTERFACE

The Modeling Interface uses the following Objects exposed in the Geometry Component:

- Geometry – Identifies spatial data used to create graphical elements. The geometry is one of:
- ILine – Consisting of a collection of coordinates made of line segments, arc segments, and bspline segments
- IText – Consisting of a coordinate along with a string buffer, orientation, and justification.
- IPoint – Consisting of a coordinate, orientation, and scale.
  ILine, IPoint, and IText all implement IGeometry, and this is what is passed to the VGIS.
- Feature – Consists of a Geometry and a database record.
- CompoundFeature - These are collections of features in a containment relationship. The container (or parent object) is a normal feature from the perspective that it has a database record and a Geometry. The child features do not have geometry.

4.1

4.1 CreateFeature

4.1.1 Description:

Inserts a record into the GIS database, initializes it from pFieldValues, and relates the specified geometries in the pGeoms to the record. The last parameter of this method is a Field Definition Structure that initially supplies the VGIS with the database and table name for creating the new feature. The actual field definitions in this structure will be set from the key value(s) of the created record so the record can be identified at a later time. The Field Definition Structure should be set up properly (i.e. including all required fields for defining keys) before sending it to the VGIS.

*Reference: Geometry Component Interface Specification*

Error types need to be returned based on failure of the method.
- Database error – The database specified does not exist
- Table error – The table does not exist in the specified database.
- Shape error – The shape of the table in the GIS does not match the shape of the table in Expert Designers configuration database. Such as a case when Expert Designer sends a field down that does not exist in the GIS.
- Constraint error – A specific field constraint in the GIS in not met when creating the feature.
- Internal error – another internal error restricted this feature from being created.

vgisErrNoDatabase
vgisErrNoTable
vgisErrShapeCompatibility
vgisErrConstraintViolation
vgisErrInternal

4.1.2 Prototype:

```
HRESULT CreateFeature(
                        [in]  IGeometries *pGeoms,
                        [in]  _Recordset *pFieldValues,
                        [in, out] _Recordset *pFeature
                        );
```

4.1.3 Arguments:

| PGeoms | [in] | IGeometries | Collection of geometries to be associated with the feature |
|---|---|---|---|
| PFieldValues | [in] | _Recordset | Collection of field values corresponding to the data attributes of the new feature |

| PFeature | [in, out] | _Recordset | Field Definition Structure containing the database and table name for the new feature. The key field columns are set and returned to the caller for feature identification. |

4.1.4 Return:

HRESULT

E_FAIL encoded with the following data
- vgisErrNoDatabase
- vgisErrNoTable
- vgisErrShapeCompatibility
- vgisErrConstraintViolation
- vgisErrInternal S_OK if create succeeded

4.2 DeleteFeature

4.2.1 Description:

Deletes record and associated geometries from the database. The feature is supplied in the a Feature Definition Structure as described in section 2.1. A bad HRESULT is returned if the delete failed.

Error types need to be returned based on failure of the method.
- Database error – The database specified does not exist
- Table error – The table does not exist in the specified database.
- Feature error – The feature could not be found in the specified table and database
- Internal error – another internal error restricted this feature from being created.

vgisErrNoDatabase
vgisErrNoTable
vgisNoFeature
vgisErrInternal

4.2.2 Prototype:

```
HRESULT DeleteFeature(
                    [in] _Recordset *pFeature
                    );
```

4.2.3 Arguments:

| PFeature | [in] | _Recordset | Recordset containing a Feature Definition Structure specifying the feature to delete. |
|---|---|---|---|

4.2.4 Return Values:

HRESULT

S_OK if delete succeeded
E_FAIL encoded with the following data
- vgisErrNoDatabase
- vgisErrNoTable
- vgisNoFeature
- vgisErrInternal

4.3 GetFeaturesAtCoord

4.3.1 Description:

Returns a collection of GIS features at the supplied coordinate. The radius defines a scan area used to gather features. All features within this radius will be included. The pFeatures parameter is a return value in the form of a Feature Definition Structure (as defined in section 2.4) that contains all selected records. This recordset should be positioned on the first record before returning.

4.3.2 Prototype:

```
HRESULT GetFeaturesAtCoord(
                           [in] double dblX,
                           [in] double dblY,
                           [in] double dblRadius,
                           [out, retval] _Recordset **ppFeatures
                          );
```

4.3.3 Arguments:

| dblX | [in] | double | X position of the coord to gather facilities |
|---|---|---|---|
| dblY | [in] | double | Y position of the coord to gather facilities |
| dblRadius | [in] | double | Scan radius for gathering facilities |
| ppFeatures | [out, retval] | _Recordset | Return container for gathered facilities. In the shape of a Feature Definition Structure |

4.3.4 Return Value:

HRESULT

4.4 MoveGeometry

4.4.1 Description:

Move a feature's geometry to a new location. The feature is supplied in a Feature Definition Structure as specified in section 2.1.

Error types need to be returned based on failure of the method.
- Database error – The database specified does not exist
- Table error – The table does not exist in the specified database.
- Feature error – The feature should not be found in the specified table and database
- Internal error – another internal error restricted this feature from being created.

vgisErrNoDatabase
vgisErrNoTable
vgisNoFeature
vgisErrInternal

4.4.2 Prototype:

```
HRESULT MoveGeometry(
                [in] _Recordset *pFeature
                [in] IGeometry *pGeometry
                );
```

4.4.3 Arguments:

| pFeature | [in] | _Recordset | Feature Definition Structure that contains the geometry to be moved |
|---|---|---|---|
| pGeometry | [in] | IGeometry | Definition of geometry to be moved |

4.4.4 Return Values:

HRESULT
S_OK if move is successful
E_FAIL encoded with the following information
- vgisErrNoDatabase
- vgisErrNoTable
- vgisNoFeature
- vgisErrInternal

4.5 AddGeometry

4.5.1 Description:

Adds specified geometry to the specified feature. The feature is supplied in a Feature Definition Structure as specified in section 2.1.

Error types need to be returned based on failure of the method.
- Database error – The database specified does not exist
- Table error – The table does not exist in the specified database.
- Feature error – The feature should not be found in the specified table and database
- Internal error – another internal error restricted this feature from being created.

vgisErrNoDatabase
vgisErrNoTable
vgisNoFeature
vgisErrInternal

4.5.2 Prototype:

```
HRESULT AddGeometry(
                [in] _Recordset *pFeature
                [in] IGeometry *pGeometry
                );
```

4.5.3 Arguments:

| _Recordset | [in] | pFeature | Feature Definition Structure that contains the name of table that include the feature |
|---|---|---|---|
| pGeometry | [in] | IGeometry | Definition of geometry to be added |

4.5.4 Return Values:

HRESULT
S_OK if move is successful
E_FAIL encoded with the following information
- vgisErrNoDatabase
- vgisErrNoTable
- vgisNoFeature
- vgisErrInternal

4.6 GetFeatureGeometry

4.6.1 Description:

Retrieves all geometry for the specified feature that have been set in the GIS. If a geometry has not been set, no information for it will be returned. The feature is supplied in a Feature Definition Structure as specified in section 2.1 and the geometry is returned in collection form.

Error types need to be returned based on failure of the method.
- Database error – The database specified does not exist
- Table error – The table does not exist in the specified database.
- Feature error – The feature should not be found in the specified table and database
- Internal error – another internal error restricted this feature from being created.

vgisErrNoDatabase
vgisErrNoTable
vgisNoFeature
vgisErrInternal

4.6.2 Prototype:

```
HRESULT GetFeatureGeometry(
                [in] _Recordset *pFeature
                [out, retval] IGeometries* *ppGeometry
                );
```

4.6.3 Arguments:

| _Recordset | [in] | pFeature | Feature Definition Structure that defines the feature to retrieve geometries for |
|---|---|---|---|
| ppGeometries | [in] | IGeometries | Geometries currently set in the GIS for the specified feature. |

4.6.4 Return Values:

HRESULT
S_OK if move is successful
E_FAIL encoded with the following information
- vgisErrNoDatabase
- vgisErrNoTable
- vgisNoFeature

- vgisErrInternal

5.0 ICHGISACTIVEVIEW INTERFACE

5.1 GetActivePath

5.1.1 Description:

Evaluates the active set of user defined points and creates an IGeometry to represent them. If a single point is placed, then a point geometry will be returned. If a series of points have been defined in the GIS, then a line type geometry will be returned, including arcs and curves.

5.1.2 Prototype:

```
HRESULT GetActivePath(
                    [out, retval] IGeometry **ppPath
                    );
```

5.1.3 Arguments:

| ppPath | [in] | IGeometry | Geometry representing the user defined active points. |

5.1.4 Return Value:

HRESULT
- S_OK if operation is successful
- E_FAIL is operation is unsuccessful

5.2 GetActivePoints

5.2.1 Description

Returns a collection of points that a user has marked in the GIS. This method makes use of a generic coordinate class used specifically for Expert Designer. If no point are active, the collection will be empty.

5.2.2 Prototype:

```
HRESULT GetActivePoints(
                        [out, retval] IGeoCoordinates **ppCoords
                        );
```

5.2.3 Arguments:

| ppCoords | [out, retval] | IGeoCoordinates | Pointer to a connection of coordinates in the GIS |
|---|---|---|---|

5.2.4 Return Value:

HRESULT
- S_OK is get is successful
- E_FAIL if get is unsuccessful

5.3 ClearActivePoints

5.3.1 Description:
Clears points placed by the user in the GIS.

5.3.2 Prototype:
```
HRESULT ClearActivePoints();
```

5.3.3 Arguments:

5.3.4 Return Value:
HRESULT
- S_OK is clear is successful
- E_FAIL if GIS returns internal error

5.4 HighlightFeature

5.4.1 Description:

Highlights a specific feature in the GIS. This feature is identified by the Feature Definition Structure as defined in section 2.1.

Error types need to be returned based on failure of the method.
- Database error – The database specified does not exist
- Table error – The table does not exist in the specified database.
- Feature error – The feature should not be found in the specified table and database
- Internal error – another internal error restricted this feature from being created.

vgisErrNoDatabase
vgisErrNoTable
vgisNoFeature
vgisErrInternal

5.4.2 Prototype:

```
HRESULT HighlightFeature(
                [in] _Recordset *pFeature,
                );
```

5.4.3 Arguments:

| pFeature | [in] | _Recordset | Feature Definition Structure that specifies the feature to highlight |
|---|---|---|---|

5.4.4 Return Value:

HRESULT
S_OK if move is successful
E_FAIL encoded with the following information
- vgisErrNoDatabase
- vgisErrNoTable
- vgisNoFeature
- vgisErrInternal

5.5 ClearSelectedFeatures

5.5.1 Description
Clears the currently selected features in the GIS.

5.5.2 Prototype:
```
HRESULT ClearSelectedFeatures();
```

5.5.3 Arguments:

5.5.4 Return Value:
HRESULT
- S_OK if clear is successful
- E_FAIL if GIS returns internal error

5.6 GetSelectedFeatures

5.6.1 Description

Basic method that returns a collection of selected features from the GIS. These features are returned in a Feature Definition Structure as described in section 2.4. If no features are currently selected, the recordset will be empty.

5.6.2 Prototype:

```
HRESULT GetSelectedFeatures(
                            [out, retval] _Recordset **ppFeatures
                           );
```

5.6.3 Arguments:

| ppFeatures | [out, retval] | _Recordset | Feature Definition Structure that contains selected features |
|---|---|---|---|

5.6.4 Return Value:

HRESULT
- S_OK if get is successful
- E_FAIL if GIS returns internal error

5.7 PanToCoord

5.7.1 Description

Centers to a specific coordinate in the GIS. The magnification parameter specifies a value to be used as a multiplier when setting the GIS window bounds. If this parameter is 1, the current window bounds will be maintained. *This method will initially work on the GIS main view only.*

5.7.2 Prototype:

```
HRESULT PanToCoord(
                    [in] double dblX,
                    [in] double dblY,
                    [in] double dblMagnification
                  );
```

5.7.3 Arguments:

| dblX | [in] | double | X position of the coord to pan to |
|---|---|---|---|
| dblY | [in] | double | Y position of the coord to pan to |
| dblMagnification | [in] | double | Magnification factor to zoom to after pan. 1 indicates stay at same scale factor |

5.7.4 Return Value:

HRESULT

5.8 PanToFeature

5.8.1 Description:

Centers to a specific feature in the GIS. This feature is identified by the Feature Definition Structure as defined in section 2.1. The magnification parameter specifies a value to be used as a multiplier when setting the GIS window bounds. If this parameter is 1, the current window bounds will be maintained. *This method will initially work on the GIS main view only.*

Error types need to be returned based on failure of the method.
- Database error – The database specified does not exist
- Table error – The table does not exist in the specified database.
- Feature error – The feature should not be found in the specified table and database
- Internal error – another internal error restricted this feature from being created.

vgisErrNoDatabase
vgisErrNoTable
vgisNoFeature
vgisErrInternal

5.8.2 Prototype:

```
HRESULT PanToFeature(
                    [in] _Recordset *pFeature
                    [in] double dblMagnification
                    );
```

5.8.3 Arguments:

| pFeature | [in] | _Recordset | Feature Definition Structure that defines the feature to pan to. |
|---|---|---|---|
| dblMagnification | [in] | double | Magnification factor of facility. 1 indicates same magnification |

5.8.4 Return Value:

HRESULT
S_OK if move is successful
E_FAIL encoded with the following information
- vgisErrNoDatabase
- vgisErrNoTable
- vgisNoFeature
- vgisErrInternal

5.9 PanToGeometry

5.9.1 Description:

Centers to a specific geometry in the GIS. The geometry does not have to exist in the GIS and is defined by the first parameter. The magnification parameter specifies a value to be used as a multiplier when setting the GIS window bounds. If this parameter is 1, the current window bounds will be maintained. *This method will initially work on the GIS main view only.*

5.9.2 Prototype:

```
HRESULT PanToGeometry(
                    [in] IGeometry *pGeometry
                    [in] double dblMagnification
                    );
```

5.9.3 Arguments:

| pGeometry | [in] | IGeometry | Geometry to center main view around |
|---|---|---|---|
| dblMagnification | [in] | double | Magnification for the bounds of the geometry |

5.9.4 Return Value:

HRESULT
- S_OK if operation is successful
- E_FAIL is operation is unsuccessful

5.10 DrawOn

5.10.1 Description:

Draws the specified geometry on the main view of the GIS. Parameters are given that specify the draw color and style that should be used to render the geometry.

The following colors can be specified as found in the vgisColor_e enumerator:

vgisColorRED
vgisColorGREEN
vgisColorBLUE
vgisColorBLACK
vgisColorGRAY

The following styles can be specified as found in the vgisLineStyle_e enumerator:

vgisStyleTHICKDASH
vgisStyleTHICKSOLID
vgisStyleTHINDASH
vgisStyleTHINSOLID

5.10.2 Prototype:

```
HRESULT DrawOn(
                [in] IGeometry *pGeometry
                [in] vgisColor_e enumColor,
                [in] vgisLineStyle_e enumLineStyle);
```

5.10.3 Arguments:

| pGeometry | [in] | IGeometry | Geometry to render in the main view |
|---|---|---|---|
| enumColor | [in] | vgisColor_e | Color to use when rendering the geometry |
| enumLineStyle | [in] | vgisLineStyle_e | Line style to use when rendering the geometry |

5.10.4 Return Value:

HRESULT
- S_OK if operation is successful
- E_FAIL is operation is unsuccessful

5.11 OffsetPathAlongFeature

5.11.1 Description:

Creates and returns an offset path built in the GIS. This path is derived from user defined points in the GIS and returned to the calling application as a line (or single point) geometry. A feature should be supplied to this method to indicate which feature to offset the path from. The user-defined points are placed on the offset feature in pairs and a 'shortest path' trace between the point pairs along the feature will be used to create the new path. A 'jump' is implied between point pairs and these points will be connected by a line segment in the path.

Initially, OffsetPathAlongFeature will be implemented in Smallworld using the existing draw_trail_offset_from_row() method that already exists in Fast Model.

5.11.2 Prototype:

```
HRESULT OffsetPathAlongFeature(
                [in] BSTR bstrOffsetFeatureType,
                [in] double dblOffsetDistance,
                [out, retval] IGeometry **ppPath
                );
```

5.11.3 Arguments:

| bstrOffsetFeatureType | [in] | BSTR | Feature type to offset path from |
|---|---|---|---|
| dblOffsetDistance | [in] | double | Distance to offset path from feature |
| ppPath | [out, retval] | IGeometry | New path created in the GIS by following the supplied feature type |

5.11.4 Return Value:

HRESULT
- S_OK if operation is successful
- E_FAIL is operation is unsuccessful

6.0 ICHGISDATABASE INTERFACE

6.1 InitGIS

6.1.1 Description
Initializes the Virtual GIS to its associated GIS.

6.1.2 Prototype:
```
HRESULT InitGIS();
```

6.1.3 Arguments:

6.1.4 Return Value:
S_OK – GIS Initialization Successful
E_FAIL – GIS Initialization Failed

6.2 CreateRecord

6.2.1 Description

Create an instance of a specified record type, setting its fields from the specified field values. The last parameter is a Feature Definition Structure (as defined in section 2.1) that initially supplies the database and table name. It will be updated with the appropriate key field values set so the new feature can be identified and selected at a later time. This structure will be set up properly (all appropriate fields added) before it is sent to the VGIS.

Error types need to be returned based on failure of the method.
- Database error – The database specified does not exist
- Table error – The table does not exist in the specified database.
- Shape error – The shape of the table in the GIS does not match the shape of the table in Expert Designers configuration database. Such as a case when Expert Designer sends a field down that does not exist in the GIS.
- Constraint error – A specific field constraint in the GIS in not met when creating the feature.
- Internal error – another internal error restricted this feature from being created.

vgisErrNoDatabase
vgisErrNoTable
vgisErrShapeCompatibility
vgisErrConstraintViolation
vgisErrInternal

6.2.2 Prototype:

```
HRESULT CreateRecord(
                            [in]      _Recordset *pFieldValues,
                            [in, out] _Recordset *ppRecordDef
                            );
```

6.2.3 Arguments:

| pFieldValues | [in] | _Recordset | Collection of field values use to create the new record |
|---|---|---|---|
| ppRecordDef | [in, out] | _Recordset | Feature Definition Structure that supplied database and table name information. Will be updated with key field values before returning |

6.2.4 Return Value:

HRESULT

S_OK if create succeeded
E_FAIL encoded with the following data
- vgisErrNoDatabase
- vgisErrNoTable
- vgisErrShapeCompatibility
- vgisErrConstraintViolation
- vgisErrInternal

6.3 DeleteRecord

6.3.1 Description:

Delete the specified record in the specified table. The feature id is supplied in a Feature Definition Structure as defined in section 2.1.

Errors types need to be returned based on failure of the method.
- Database error – The database specified does not exist
- Table error – The table does not exist in the specified database.
- Feature error – The feature should not be found in the specified table and database
- Internal error – another internal error restricted this feature from being created.

vgisErrNoDatabase
vgisErrNoTable
vgisNoFeature
vgisErrInternal

6.3.2 Prototype:

```
HRESULT DeleteRecord(
                                [in] _Recordset pRecord,
                                );
```

6.3.3 Arguments:

| pRecord | [in] | _Recordset | Feature Definition Structure that supplies the feature to delete. |

6.3.4 Return Value:

HRESULT
S_OK if operation is successful
E_FAIL encoded with the following information
- vgisErrNoDatabase
- vgisErrNoTable
- vgisNoFeature
- vgisErrInternal

6.4 UpdateRecord

6.4.1 Description

Updates the specified fields of the specified record. The feature id is supplied in a Feature Definition Structure and should include all key field names and values so it can be uniquely identified. The pFieldValues is a set of only field names and the values that need to be updated.

Errors types need to be returned based on failure of the method.
- Database error – The database specified does not exist
- Table error – The table does not exist in the specified database.
- Feature error – The feature should not be found in the specified table and database
- Internal error – another internal error restricted this feature from being created.

vgisErrNoDatabase
vgisErrNoTable
vgisNoFeature
vgisErrInternal

6.4.2 Prototype:

```
HRESULT UpdateRecord(
                    [in] _Recordset *pRecord,
                    [in] _Recordset *pFieldValues);
```

6.4.3 Arguments:

| PRecordDef | [in] | _Recordset | Feature Definition Structure that identifies the feature to update. |
|---|---|---|---|
| PFieldValues | [in] | _Recordset | Recordset with all field name and values that need to be updated. |

6.4.4 Return Value:

HRESULT
S_OK if operation is successful
E_FAIL encoded with the following information
- vgisErrNoDatabase
- vgisErrNoTable
- vgisNoFeature
- vgisErrInternal

GetRecords

6.4.5 Description:

Retrieves a set of database records. The database and table name, as well as all field that will be used to select records are Defined in the Feature Definition Structure defined in section 2.3. The return value is also a Feature Definition Structure that include unique feature definitions as described in section 2.4.

Errors types need to be returned based on failure of the method.
- Database error – The database specified does not exist
- Table error – The table does not exist in the specified database.
- Shape error – The shape of the table in the GIS does not match the shape of the table in Expert Designers configuration database. Such as a case when Expert Designer sends a field down that does not exist in the GIS.
- Internal error – another internal error restricted this feature from being created.

vgisErrNoDatabase
vgisErrNoTable
vgisErrShapeCompatibility
vgisErrInternal

6.4.6 Prototype:

```
HRESULT GetRecords(
                [in] _Recordset *pSelectCriteria,
                [out, retval] _Recordset **ppRecords,
                );
```

6.4.7 Arguments:

| pSelectCriteria | [in] | _Recordset | Feature Definition Structure with the database and table name as well as field names and values that define the select statement. |
|---|---|---|---|
| ppFeatures | [out, retval] | _Recordset | Return value that includes definitions of all selected features. |

6.4.8 Return Values:

HRESULT
S_OK if operation is successful
E_FAIL encoded with the following information
- vgisErrNoDatabase
- vgisErrNoTable
- vgisErrShapeCompatibility

- vgisErrInternal

6.5 GetShapeOfTable

6.5.1 Description:

Retrieves the shape of the specified table. The table shape is defined by an empty recordset returned from this method.

- Database error – The database specified does not exist
- Table error – The table does not exist in the specified database.

vgisErrNoDatabase
vgisErrNoTable

6.5.2 Prototype:

```
HRESULT GetShapeOfTable(
                [in] _Recordset *pTableDef,
                [out, retval] _Recordset **ppShapeRs,
                );
```

6.5.3 Arguments:

| pTableDef | [in] | _Recordset | Feature Definition Structure of the database and table name to retrieve table shape for. |
|---|---|---|---|
| ppShapeRs | [out, retval] | _Recordset | Empty recordset that defines the shape of the specified table. |

6.5.4 Return Values:

HRESULT
S_OK if operation is successful
E_FAIL encoded with the following information
- vgisErrNoDatabase
- vgisErrNoTable

7.0 ICHGISTOPOLOGY INTERFACE

After reviewing requirements for establishing GIS connectivity, two basic types of connectivity were uncovered. The first is a direct GIS Connection, where the GIS system views and stores the features as connected. The second was an Attachment, where additional features or tables are added to the GIS database (utility schema) to form associations between facilities in the GIS (structure to device or structure to conductor). The general concern was to try to meet requirements for allowing feature1 to connect to feature2 as well as allowing feature1 to be attached (not connected) to feature2.

GIS Connection will be established from the VGIS by calling GIS connection primitives when needed, but nothing more. Attachment, on the other hand, might require more customizable functionality.

The Following table outline specific methods for ATTACHING features:

| Customer | Structural Feature Grouping | Conductor/Structure Attachment |
|---|---|---|
| PSCO | None | None |
| AP/Conectiv/UCU/CH | Intermediate Device – Established Connectivity | Intermediate Device – Established Connectivity (Structure Node) |
| Duke/Cornerstone | Direct Attachment – Soft Join | Intermediate Device – Established Connectivity (Conductor Path) |

With these variations in mind, customization will be performed on this part of the Virtual GIS by the application service delivery team to write schema specific code for determining Structural Attachment additions and retrievals.

7.1 FlowConnectUpstream

7.1.1 Description:

Connects the supplied FEATURE upstream of the supplied DOWNSTREAMFEATURE. Both features are supplied as a Feature Definition Structure defined in section 2. The Connection Point is supplied as reference and to be used by GIS systems that use point coincidence to establish connectivity. This coordinate is the common point all features share to establish connectivity. It may not be used in some GIS systems.

Errors types need to be returned based on failure of the method.
- Database error – The database specified does not exist
- Table error – The table does not exist in the specified database.
- Feature error – The feature should not be found in the specified table and database
- Internal error – another internal error restricted this feature from being created.

vgisErrNoDatabase
vgisErrNoTable
vgisErrNoFeature
vgisErrInternal

7.1.2 Prototype:

```
HRESULT FlowConnectUpstream(
            [in] _Recordset* pFeature,
            [in] _Recordset* pDownstreamFeature,
            [in] IGeoCoordinate* pConnectionPt
                    );
```

7.1.3 Arguments:

| pFeature | [in] | _Recordset | Feature Definition Structure that specifies the feature that will be connected as a parent |
|---|---|---|---|
| pDownstreamFeature | [in] | _Recordset | Feature Definition Structure that specifies the feature to connect the new parent to. |
| pConnectionPt | [in] | IGeoCoordinate | Coordinate at which features connect. This is a parameter that may not be used. |

7.1.4 Return:

S_OK is connect is successful
E_FAIL encoded with the following information

- vgisErrNoDatabase
- vgisErrNoTable
- vgisErrNoFeature
- vgisErrInternal

7.2 FlowConnectDownstream

7.2.1 Description:

Connects the supplied FEATURE downstream of the supplied UPSTREAMFEATURE. Both features are supplied as a Feature Definition Structure defined in section 2. The Connection Point is supplied as reference and to be used by GIS systems that use point coincidence to establish connectivity. This point is the common coordinate all features share to establish connectivity. It may not be used in some GIS systems.

Errors types need to be returned based on failure of the method.
- Database error – The database specified does not exist
- Table error – The table does not exist in the specified database.
- Feature error – The feature should not be found in the specified table and database
- Internal error – another internal error restricted this feature from being created.

vgisErrNoDatabase
vgisErrNoTable
vgisErrNoFeature
vgisErrInternal

7.2.2 Prototype:

```
HRESULT FlowConnectDownstream(
            [in] _Recordset* pFeature,
            [in] _Recordset* pUpstreamFeature,
            [in] IGeoCoordinate* pConnectionPt
                );
```

7.2.3 Arguments:

| pFeature | [in] | _Recordset | Feature Definition Structure that specifies the feature that will be connected downstream |
|---|---|---|---|

| pUpstreamFeature | [in] | _Recordset | Feature Definition Structure that specifies the upstream feature to connect to. |
|---|---|---|---|
| pConnectionPt | [in] | IGeoCoordinate | Coordinate at which features connect. This is a parameter that may not be used. |

7.2.4 Return:

S_OK is connect is successful
E_FAIL encoded with the following information
- vgisErrNoDatabase
- vgisErrNoTable
- vgisErrNoFeature
- vgisErrInternal

7.3 FlowConnectFeature

7.3.1 Description:

Connects the supplied FEATURE downstream of the supplied UPSTREAMFEATURE and upstream of the supplied DOWNSTREAMFEATURE. All features are supplied as a Feature Definition Structure defined in section 2. The Connection Point is to be used by GIS systems that use point coincidence to establish connectivity. This point is the common coordinate all features share to establish connectivity. It may not be used in some GIS systems.

Errors types need to be returned based on failure of the method.
- Database error – The database specified does not exist
- Table error – The table does not exist in the specified database.
- Feature error – The feature should not be found in the specified table and database
- Internal error – another internal error restricted this feature from being created.

vgisErrNoDatabase
vgisErrNoTable
vgisErrNoFeature
vgisErrInternal

7.3.2 Prototype:

```
HRESULT FlowConnectFeature(
        [in] _Recordset* pFeature,
        [in] _Recordset* pUpstreamFeature,
        [in] _Recordset* pDownstreamFeature,
        [in] IGeoCoordinate* pConnectionPt
```

);

7.3.3 Arguments:

| pFeature | [in] | _Recordset | Feature Definition Structure that specifies the feature that will be connected |
|---|---|---|---|
| pUpstreamFeature | [in] | _Recordset | Feature Definition Structure that specifies the upstream feature |
| pDownstreamFeature | [in] | _Recordset | Feature Definition Structure that specifies the downstream feature |
| pConnectionPt | [in] | IGeoCoordinate | Coordinate at which features connect. This is a parameter that may not be used. |

7.3.4 Return:

S_OK is connect is successful
E_FAIL encoded with the following information
- vgisErrNoDatabase
- vgisErrNoTable
- vgisErrNoFeature
- vgisErrInternal

7.4 FlowDisconnectFeature

7.4.1 Description:

Disconnects the two supplied features from on another. Both features are supplied as a Feature Definition Structure defined in section 2.

Errors types need to be returned based on failure of the method.
- Database error – The database specified does not exist
- Table error – The table does not exist in the specified database.
- Feature error – The feature should not be found in the specified table and database
- Internal error – another internal error restricted this feature from being created.

vgisErrNoDatabase
vgisErrNoTable
vgisErrNoFeature vgisErrInternal

7.4.2 Prototype:

```
HRESULT FlowDisconnectFeature(
                [in] _Recordset* pFeature,
                [in] _Recordset* pConnectedFeature
                    );
```

7.4.3 Arguments:

| pFeature | [in] | _Recordset | Feature Definition Structure that specifies the feature that will be disconnected |
| pConnectedFeature | [in] | _Recordset | Feature Definition Structure that specifies the feature to disconnect from |

7.4.4 Return:

S_OK is connect is successful
E_FAIL encoded with the following information
- vgisErrNoDatabase
- vgisErrNoTable
- vgisErrNoFeature
- vgisErrInternal

7.5 FlowDisconnectAll

7.5.1 Description:

Disconnects the supplied FEATURE from all of it's current connections. The feature is supplied as a Feature Definition Structure defined in section 2.

Errors types need to be returned based on failure of the method.
- Database error – The database specified does not exist
- Table error – The table does not exist in the specified database.
- Feature error – The feature should not be found in the specified table and database
- Internal error – another internal error restricted this feature from being created.

vgisErrNoDatabase
vgisErrNoTable
vgisErrNoFeature
vgisErrInternal

7.5.2 Prototype:

```
HRESULT FlowDisconnectFeature(
                [in] _Recordset* pFeature
                            );
```

7.5.3 Arguments:

| pFeature | [in] | _Recordset | Feature Definition Structure that specifies the feature that will be disconnected |
|---|---|---|---|

7.5.4 Return:

S_OK is connect is successful
E_FAIL encoded with the following information
- vgisErrNoDatabase
- vgisErrNoTable
- vgisErrNoFeature
- vgisErrInternal

7.6 GetUpstreamFlowConnections

7.6.1 Description:

Gets all upstream connections for the specified feature. Features are both supplied and returned as a Field Definition Structure. Returned features are supplied with only key field definitions.

Errors types need to be returned based on failure of the method.
- Database error – The database specified does not exist
- Table error – The table does not exist in the specified database.
- Feature error – The feature should not be found in the specified table and database
- Internal error – another internal error restricted this feature from being created.

vgisErrNoDatabase
vgisErrNoTable
vgisErrNoFeature
vgisErrInternal

7.6.2 Prototype:

```
HRESULT GetUpstreamFlowConnections (
            [in] _Recordset* pFeature,
            [out, retval] _Recordset** ppConnections
                            );
```

7.6.3 Arguments:

| pFeature | [in] | _Recordset | Feature Definition Structure that specifies the feature to retrieve upstream connections. |
|---|---|---|---|
| ppConnections | [out, retval] | _Recordset | Collection of connected features. |

7.6.4 Return:

S_OK is connect is successful
E_FAIL encoded with the following information
- vgisErrNoDatabase
- vgisErrNoTable
- vgisErrNoFeature
- vgisErrInternal

7.7 GetDownstreamFlowConnections

7.7.1 Description:

Gets all downstream connections for the specified feature. Features are both supplied and returned as a Field Definition Structure. Returned featured are supplied with only key field definitions.

Errors types need to be returned based on failure of the method.
- Database error – The database specified does not exist
- Table error – The table does not exist in the specified database.
- Feature error – The feature should not be found in the specified table and database
- Internal error – another internal error restricted this feature from being created.

vgisErrNoDatabase
vgisErrNoTable
vgisErrNoFeature
vgisErrInternal

7.7.2 Prototype:

```
HRESULT GetDownstreamConnections (
          [in] _Recordset* pFeature,
          [out, retval] _Recordset** ppConnections
                    );
```

7.7.3 Arguments:

| pFeature | [in] | _Recordset | Feature Definition Structure that specifies the feature to retrieve downstream connections. |
|---|---|---|---|
| ppConnections | [out, retval] | _Recordset | Collection of connected features. |

7.7.4 Return:

S_OK is connect is successful
E_FAIL encoded with the following information
- vgisErrNoDatabase
- vgisErrNoTable
- vgisErrNoFeature
- vgisErrInternal

7.8 GetAllFlowConnections

7.8.1 Description:

Gets all connections (upstream and downstream) for the specified feature. Features are both supplied and returned as a Field Definition Structure. Returned featured are supplied with only key field definitions.

Errors types need to be returned based on failure of the method.
- Database error – The database specified does not exist
- Table error – The table does not exist in the specified database.
- Feature error – The feature should not be found in the specified table and database
- Internal error – another internal error restricted this feature from being created.

vgisErrNoDatabase
vgisErrNoTable
vgisErrNoFeature
vgisErrInternal

7.8.2 Prototype:

```
HRESULT GetAllGisConnections (
            [in] _Recordset* pFeature,
            [out, retval] _Recordset** ppConnections
                        );
```

7.8.3 Arguments:

| pFeature | [in] | _Recordset | Feature Definition Structure that specifies the feature to retrieve connections. |
|---|---|---|---|
| ppConnections | [out, retval] | _Recordset | Collection of connected features. |

7.8.4 Return:

S_OK is connect is successful
E_FAIL encoded with the following information
- vgisErrNoDatabase
- vgisErrNoTable
- vgisErrNoFeature
- vgisErrInternal

7.9 AddDependentAttachment

7.9.1 Description:

Adds the supplied feature or features (devices or conductors) as attachments to the specified structure structures. Both features should be supplied as Feature Definition Structures as defined in section 2.0. The connection point is a coordinate that specifies a common point at which all features a attached and should be used with Utility Schemas that have been implemented using some form of coincidence or connectivity to attach features to structures Multiple instances of structures or attachments can be passed through, in which case all attachments supplied will be added to all structures supplied. Remember though, that all structures and attachments must share the same connection point.

Errors types need to be returned based on failure of the method.
- Database error – The database specified does not exist
- Table error – The table does not exist in the specified database.
- Feature error – The feature should not be found in the specified table and database
- Internal error – another internal error restricted this feature from being created.

vgisErrNoDatabase
vgisErrNoTable
vgisErrNoFeature
vgisErrInternal

7.9.2 Prototype:

```
HRESULT AddDependentAttachment (
         [in] _Recordset* pStructures,
         [in] _Recordset* pFeatures,
         [in] IGeoCoordinate* pAttachmentPt
                );
```

7.9.3 Arguments:

| pStructures | [in] | _Recordset | Feature Definition Structure that specifies the structure or structures to add the features to. |
|---|---|---|---|
| pFeatures | [in] | _Recordset | Feature Definition Structure that specifies the feature or features to add as an attachment. |
| pAttachmentPt | [in] | IGeoCoordinate | Coordinate at which features are attached. This is a parameter that may not be used. |

7.9.4 Return:

S_OK is connect is successful
E_FAIL encoded with the following information
- vgisErrNoDatabase
- vgisErrNoTable
- vgisErrNoFeature
- vgisErrInternal

7.10 RemoveDependentAttachment

7.10.1 Description:

Removes the supplied feature or features (device or conductor) from the specified structure or structures. Both features should be supplied as Feature Definition Structures as defined in section 2.0.

Multiple instances of both the attachment or structure can be passed though in which case all supplied attachments will be removed from all supplied structures.

Errors types need to be returned based on failure of the method.
- Database error – The database specified does not exist

- Table error – The table does not exist in the specified database.
- Feature error – The feature should not be found in the specified table and database
- Internal error – another internal error restricted this feature from being created.

vgisErrNoDatabase
vgisErrNoTable
vgisErrNoFeature
vgisErrInternal

7.10.2 Prototype:

```
HRESULT RemoveDependentAttachment (
            [in] Recordset* pStructures,
            [in] Recordset* pFeatures
                      );
```

7.10.3 Arguments:

| pStructures | [in] | _Recordset | Feature Definition Structure that specifies the structure or structures to remove the attachments from. |
|---|---|---|---|
| pFeatures | [in] | _Recordset | Feature Definition Structure that specifies the attachments to remove. |

7.10.4 Return:

S_OK is connect is successful
E_FAIL encoded with the following information
- vgisErrNoDatabase
- vgisErrNoTable
- vgisErrNoFeature
- vgisErrInternal

7.11 GetDependentAttachments

7.11.1 Description:

Gets all attachments for the specified feature. The second parameter is a type specification filter from the vgisAttachType_e enum that will be one of the following:

```
vgisTypeALL
vgisTypePOINT
```

```
vgisTypeLINE
```

Attached features are returned in the form of a Field Definition Structure as defined in section 2.4.

Errors types need to be returned based on failure of the method.
- Database error – The database specified does not exist
- Table error – The table does not exist in the specified database.
- Feature error – The feature should not be found in the specified table and database
- Internal error – another internal error restricted this feature from being created.

vgisErrNoDatabase
vgisErrNoTable
vgisErrNoFeature
vgisErrInternal

7.11.2 Prototype:

```
HRESULT GetDependentAttachments (
            [in] _Recordset* pStructure,
            [in] attachType_e attachType,
            [out,retval] _Recordset** ppAttachments,
                        );
```

7.11.3 Arguments:

| pStructure | [in] | _Recordset | Feature Definition Structure that specifies the structure to retrieve attachments for. |
|---|---|---|---|
| attachType | [in] | attachType_e | Feature Definition Structure that specifies the retrieval type filter. |
| ppAttachments | [out, retval] | _Recordset | Return collection of attached features. |

7.11.4 Return:

S_OK is connect is successful
E_FAIL encoded with the following information
- vgisErrNoDatabase
- vgisErrNoTable
- vgisErrNoFeature
- vgisErrInternal

7.12 TraceNetwork

7.12.1 Description:

Retrieves a collection of features from the network using a standard trace in the GIS. Must supply a starting point as well as criteria to specify stop points along the network. If no stop criteria is supplied, an entire network trace will be performed. The stop criteria should be in the form of a Feature Definition Structure as defined in section 2.2. The returned collection of network features is in the form of a Feature Definition Structure specifying the database name, table name, and key field values for each feature as defined in section 2.4.

*Note: Implementation of this method will vary from one GIS to another. In some cases, it may only contain a call to some GIS trace primitive, and in other cases in may have to actually implement the trace.*

*Note: Only feature database names, table names, and key fields are return. If additional information is needed about the features, it will have to be selected from the GIS using GetRecords( ).*

7.12.2 Prototype:

```
HRESULT TraceNetwork (
            [in] _Recordset* pStartFeature,
            [in] _Recordset* pStopCriteria,
            [out,retval] _Recordset** ppNetworkFeatures,
                    ) ;
```

7.12.3 Arguments:

| pStartFeature | [in] | _Recordset | Feature Definition Structure that feature to start trace from. |
|---|---|---|---|
| pStopCriteria | [in] | _Recordset | Feature Definition Structure that stop criteria for the network trace |
| ppNetworkFeatures | [out, retval] | _Recordset | Return collection of features retrieved from network trace. |

7.12.4 Return:

HRESULT

7.13 ModelNetworkFromTrace

7.13.1 Description:

This method will be used to create a detailed model of a network using the results of a GIS trace. The return value of this method call should be a pointer to an INetwork that can be traversed through a series of network nodes and segments (defined in the detailed analysis specification). It shall also create a series of network features associated to the appropriated node or segment in the network.

*Note: Implementation of this method will vary from data model to data model (even for a single GIS) and may require customization at implementation time.*

7.13.2 Prototype:

```
HRESULT ModelNetworkFromTrace (
        [in]      BSTR                bstrNetworkSpec,
        [in]      IGeoCoordinate*     pStartCoord,
        [in]      _Recordset*         pStopCriteria,
        [in]      SAFEARRAY*          *ppsaDesiredFeatures,
        [in, out] INetwork*           *ppNetwork
                       );
```

7.13.3 Arguments:

| bstrNetworkSpec | [in] | BSTR | Specification of the type of network that is to be built. This is a GIS specific name that may be indicated differently for each system. |
|---|---|---|---|
| pStartCoord | [in] | IGeoCoordinate | Coordinate supplied to specify the starting point of the network trace |
| pStopCriteria | [in] | _Recordset | Specifies stop criteria for the network trace. Supplied in the form of a Feature Definition Structure. |
| ppsaDesiredFeatures | [in] | SAFEARRAY | A two dimensional safearray that contains a ftr type pointer and a pre-defined recordset that contains the desired field values from each feature. |
| ppNetwork | [in, out] | INetwork | Pointer to the network that was created from the current trace results |

7.13.4 Return:

HRESULT

7.14 ModelNetworkFromBounds

7.14.1 Description:

This method will be used to create a detailed model of a network in the GIS using a line type geometry as the network bounds. The geometry that defines the network boundary should be a simple closed line that does not include any arcs or curves. The result of this method call will be a pointer to an INetwork that can be traversed through a series of network nodes and segments (defined in the detailed network specification) as well as a series of network features associated to the appropriated node or segment in the network.

*Note: Implementation of this method will vary from data model to data model (even for a single GIS) and may require customization at implementation time.*

7.14.2 Prototype:

```
HRESULT ModelNetworkFromBounds  (
        [in]  BSTR                bstrNetworkSpec,
        [in]  IGeometry*          pNetworkBounds,
        [in]  SAFEARRAY*          *ppsaDesiredFeatures,
        [in, out] INetwork*       *ppNetwork
                        );
```

7.14.3 Arguments:

| bstrNetworkSpec | [in] | BSTR | Specification of the type of network that is to be built. This is a GIS specific name that may be indicated differently for each system. |
|---|---|---|---|
| pNetworkBounds | [in] | IGeometry | Closed line type geometry representing the bound of the desired network. |
| ppsaDesiredFeatures | [in] | SAFEARRAY | A two dimensional safearray that contains a feature name (table name) and a pre-defined recordset that contains the desired field values from each feature. |

| ppNetwork | [in, out] | INetwork | Pointer to the network that was created from the current trace results |

7.14.4 Return:

HRESULT

8.0 ICHGISWORKSPACE INTERFACE

The ICHGISWorkspace interface controls the GIS workarea - this varies depending upon which GIS is currently in use. For Smallworld it means moving through and creating new alternatives, in Intergraph it means moving through and creating new worksets, and in Conic it means moving through and creating new files. Each user will have his/her own HOME workspace (an alternative in Smallworld and a directory in Intergraph and Conic) and this will be the base for all new workspace activities.

8.1 Open

8.1.1 Description:

Opens the workspace with the supplied name. Workspace names can be supplied in one of two formats.

1. Complete path specification starting from the top. Identified in the VGIS as starting with a "\".

"\working_top\design101299"

2. Relative path specification. Identified in the VGIS as starting with a character other than a "\" or starting with a "..\", in which case the VGIS will go up to the parent of the current workspace and start from there.

"\design101399"
    or
    "..\working_top\design_101499"

This function will first check to see if the specified workspace exists. If it does not, a bad HRESULT will be returned indicating an unsuccessful open. Before opening a new workspace, be sure that the current workspace has not been modified or that it is no longer dirty. If it is dirty, a bad HRESULT will be returned to indicate the workspace was unsuccessfully opened.

Smallworld – Goto alternative
Intergraph – Open workset
Conic – Open file

Errors types need to be returned based on failure of the method.
- Already Open – The GIS is already in the current workspace
- Current Workspace Updated – Can not open new workspace because current workspace has been updated without saving.

vgisErrWkspAlreadyOpen
vgisErrWkspCurrentUpdated

8.1.2 Prototype:

```
HRESULT Open(
            [in] BSTR bstrDatabaseName
            [in] BSTR bstrWorkspaceName
                       );
```

8.1.3 Arguments:

| bstrDatabaseName | [in] | BSTR | Name of the database to open. |
|---|---|---|---|
| bstrWorkspaceName | [in] | BSTR | Name of the workspace to open. |

8.1.4 Return:

S_OK is Open succeeded
E_FAIL encoded with the following information
- vgisErrWkspAlreadyOpen
- vgisErrWkspCurrentUpdated

8.2 Close

8.2.1 Description:

Close the current workspace. Before closing the current workspace, be sure that it has not been modified, or that it is no longer dirty. If it is dirty, a bad HRESULT will be returned to indicate the workspace was unsuccessfully closed. The result of a successful function call will be a VGIS initialized to the users HOME workspace.

Smallworld – Goto users HOME alternative
Intergraph – Close current workset and open the index.dgn
Conic – Close current file and open the basemap file Errors types need to be returned based on failure of the method.
- Current Workspace Updated – Can not open new workspace because current workspace has been updated without saving.

vgisErrWkspCurrentUpdated

8.2.2 Prototype:

```
HRESULT Close(
              [in] BSTR bstrDatabaseName
              );
```

8.2.3 Arguments:

| bstrDatabaseName | [in] | BSTR | Name of the database to close. |

8.2.4 Return:

S_OK is Open succeeded
E_FAIL encoded with the following information
- vgisErrWkspCurrentUpdated

8.3 Delete

8.3.1 Description:

Deletes the specified workspace from the GIS

Errors types need to be returned based on failure of the method.
- Current Workspace Updated – Can not open new workspace because current workspace has been updated without saving.
- Invalid Workspace Name – The new workspace can not be created using the supplied name.

vgisErrWkspCurrentUpdated
vgisErrWkspNameInvalid

8.3.2 Prototype:

```
HRESULT Close(
          [in] BSTR bstrDatabaseName
          [in] BSTR bstrWorkspaceName
               );
```

8.3.3 Arguments:

| bstrDatabaseName | [in] | BSTR | Name of the database to delete the workspace from. |
| bstrWorkspaceName | [in] | BSTR | Name of the workspace to delete. |

8.3.4 Return:

S_OK is Open succeeded
E_FAIL encoded with the following information
- vgisErrWkspCurrentUpdated
- vgisErrWkspInvalid

8.4 Publish

8.4.1 Description:

Publish the current workspace back to the master database.

Smallworld – Merge and post back to the users HOME directory
Intergraph – Write the current workset back to Master
Conic – Import current file into Master GIS

8.4.2 Prototype:

```
HRESULT Publish(
                [in] BSTR bstrDatabaseName
                );
```

8.4.3 Arguments:

| bstrDatabaseName | [in] | BSTR | Name of the database to publish. |

8.4.4 Return:

S_OK is publish succeeded
E_FAIL is publish failed

8.5 Subscribe

8.5.1 Description:

Create a new workspace with the supplied name. Workspace names can be supplied in one of two formats.

1. Complete path specification starting from the top. Identified in the VGIS as starting with a "\".

*"\working_top\design101299-"*

2. Relative path specification. Identified in the VGIS as starting with a character other than a "\" or starting with a "..\", in which case the VGIS will go up to the parent of the current workspace and start from there.

*"\design101399"*
   or
   *"..\working_top\design_101499-"*

Workspace names must be kept unique at any given level. This function will first check to see if the workspace already exists before trying to create it. It if does exist, a bad HRESULT will be returned indicating an unsuccessful subscribe. Before subscribing to a new workspace, be sure that the current workspace has not been modified, or if it has been modified, it is no longer dirty. If it is dirty, a bad HRESULT will be returned to indicate the workspace was unsuccessfully subscribed to.

Smallworld – Create a new alternative relative to the supplied name
Intergraph – Create a new workset
Conic – Export to a file of the supplied name Errors types need to be returned based on failure of the method.
- Invalid Workspace Name – The new workspace can not be created using the supplied name.

vgisErrWkspNameInvalid

8.5.2 Prototype:

```
HRESULT Subscribe(
            [in] BSTR bstrDatabaseName,
            [in] BSTR bstrWorkspaceName
                        );
```

8.5.3 Arguments:

| bstrDatabaseName | [in] | BSTR | Name of the database to create the new workspace from. |
|---|---|---|---|
| bstrWorkspaceName | [in] | BSTR | Name of the workspace to create. |

8.5.4 Return:

S_OK is Open succeeded
E_FAIL encoded with the following information
- vgisErrWkspNameInvalid

8.6 MakeWritable

8.6.1 Description:

Make the current workspace in the supplied database writeable.

Smallworld – Make the current alternative writeable
Intergraph – Make the current workspace writeable
Conic – Make the current data area and file writeable Errors types need to be returned based on failure of the method.
- Invalid Workspace Name – The new workspace can not be created using the supplied name.

vgisWkspNameInvalid

8.6.2 Prototype:

```
HRESULT MakeWritable(
                [in] BSTR bstrDatabaseName
                );
```

8.6.3 Arguments:

| bstrDatabaseName | [in] | BSTR | Name of the database to make writeable. |

8.6.4 Return:

S_OK is Open succeeded
E_FAIL encoded with the following information
- vgisWkspNameInvalid

8.7 MakeReadonly

8.7.1 Description:

Make the current workspace in the supplied database read-only. If the current workspace has been modified without saving, i.e. dirty, then a bad HRESULT will be returned indicating a failed call.

Smallworld – Make the current alternative read-only
Intergraph – Make the current workspace read-only
Conic – Make the current data area and file read-only Errors types need to be returned based on failure of the method.
- Invalid Workspace Name – The new workspace can not be created using the supplied name.
- Current Workspace Updated – Can not open new workspace because current workspace has been updated without saving.

vgisErrWkspNameInvalid
vgisErrWkspCurrentUpdated

8.7.2 Prototype:

```
HRESULT MakeReadonly(
```

```
                [in] BSTR bstrDatabaseName
                );
```

8.7.3 Arguments:

| bstrDatabaseName | [in] | BSTR | Name of the database to make read-only. |

8.7.4 Return:

S_OK is Open succeeded
E_FAIL encoded with the following information
- vgisErrWkspNameInvalid
- vgisErrWkspCurrentUpdated

8.8 IsWriteable

8.8.1 Description:

Check to see if the current workspace is writeable.

Smallworld – Check current alternative
Intergraph – Check current workset
Conic – Check current data area and file

8.8.2 Prototype:

```
HRESULT IsWriteable(
        [in] BSTR bstrDatabaseName,
        [out, retval] BOOL *pbSuccess
                );
```

8.8.3 Arguments:

| bstrDatabaseName | [in] | BSTR | Name of database to check. |
| pbSuccess | [out, retval] | BOOL | Return status for the IsWriteable check. |

8.8.4 Return:
HRESULT

8.9 StartUndoTransaction

8.9.1 Description:
Starts a new undo transaction in the workspace

Smallworld – Start a new lightweight transaction
Intergraph – Starts a new undo transaction
Conic – Starts a new undo transaction

8.9.2 Prototype:
HRESULT StartUndoTransaction();

8.9.3 Arguments:
None

8.9.4 Return:
HRESULT

8.10 EndUndoTransaction

8.10.1 Description:
Ends the current undo transaction in the workspace

Smallworld – End the current lightweight transaction
Intergraph – Ends the current undo transaction
Conic – Ends the current undo transaction

8.10.2 Prototype:
HRESULT EndUndoTransaction();

8.10.3 Arguments:
None

8.10.4 Return:
HRESULT

8.11 UndoTransaction

8.11.1 Description:
Undoes the current transaction in the redo/undo stack. Sets the pointer to the previous undo in the stack.

Smallworld – Undo current transaction on the stack
Intergraph – Undo current transaction on the stack
Conic – Undo current transaction on the stack

8.11.2 Prototype:

```
HRESULT UndoTransaction();
```

8.11.3 Arguments:

None

8.11.4 Return:

HRESULT

8.12 RedoTransaction

8.12.1 Description:

Redoes the current transaction in the redo/undo stack. Sets the pointer to the next redo in the stack.

Smallworld – Redo current transaction on the stack
Intergraph – Redo current transaction on the stack
Conic – Redo current transaction on the stack

8.12.2 Prototype:

```
HRESULT RedoTransaction();
```

8.12.3 Arguments:

None

8.12.4 Return:

HRESULT

8.13 Commit

8.13.1 Description:

Commits changes to the GIS.

Smallworld – Commits changes
Intergraph – Saves workspace file
Conic – Saves working file

8.13.2 Prototype:
```
HRESULT Commit();
```

8.13.3 Arguments:
None

8.13.4 Return:
HRESULT

8.14 Rollback

8.14.1 Description:
Rolls back all changes to the GIS since the last commit.

Smallworld – Commits changes
Intergraph – Saves workspace file
Conic – Saves working file

8.14.2 Prototype:
```
HRESULT Rollback();
```

8.14.3 Arguments:
None

8.14.4 Return:
HRESULT

8.15 GetDatabaseNames

8.15.1 Description:
Returns the names of all the available databases in the GIS

8.15.2 Prototype:
```
HRESULT GetDatabaseNames(
         [out, retval] _Recordset **ppDatabases);
```

8.15.3 Arguments:

| ppDatabases | [out, retval] | _Recordset | Return values containing the names of all the databases |

8.15.4 Return:

HRESULT

8.16 GetTablesInDatabase

8.16.1 Description:

Retrieves the names of all the tables is the specified database of the GIS

Errors types need to be returned based on failure of the method.
- Database error – The database specified does not exist vgisErrNoDatabase

8.16.2 Prototype:

```
HRESULT GetTablesInDatabase(
                [in] BSTR bstrDatabaseName,
                [out, retval] _Recordset **ppTableNames);
```

8.16.3 Arguments:

| bstrDatabaseName | [in] | BSTR | Name of database to retrieve tables for |
|---|---|---|---|
| ppTableNames | [out, retval] | _Recordset | Return value containing the names of all tables in the specified database |

8.16.4 Return:

S_OK is connect is successful
E_FAIL encoded with the following information
- vgisErrNoDatabase

9.0 ICHGISPLOT INTERFACE

ICHGISPlot will expose methods to provide functionality for simple plotting. Initially, it will delegate most of the actual work to the GIS keeping its implementation as small as possible. ICHGISPlot will only provide data display to the main viewport of the plot layout or template. Plotting data will be passed between ICHGISPlot and an application using ICHGISPlot with an interface called ICHGISPlotLayout defined in section following section.

9.1 GetAvailableLayouts

9.1.1 Description:

Return a set of ICHGISPlotLayouts that define various parameters, including name, main viewport bounds, page size, etc. An empty collection will be returned if no layouts are available.

9.1.2 Prototype:

```
HRESULT GetAvailableLayouts(
        [out, retval] ICHGISPlotLayouts        **ppLayouts,
                            );
```

9.1.3 Arguments:

| ppLayouts | [out, retval] | IGHGISPlotLayouts | A com collection of valid plot layouts retrieved from the GIS.. |
|---|---|---|---|

9.1.4 Return:

S_OK

9.2 Preview

9.2.1 Description:

Display a GIS plot preview using functionality from the GIS.

9.2.2 Prototype:

```
HRESULT Preview(
          [in] ICHGISPlotLayout      *pPlotLayout
                    );
```

9.2.3 Arguments:

| pPlotLayout | [in] | ICHGISPlotLayout | Layout parameters that define the current plot specifications. |

9.2.4 Return:

S_OK or E_FAIL

9.3 Plot

9.3.1 Description:

Sends a plot to the a windows printer device.

Errors types need to be returned based on failure of the method.
- Invalid Device – The specified device is not valid or is not available vgisErrPlotDeviceInvalid

9.3.2 Prototype:

```
HRESULT Plot(
            [in] BSTR                    bstrDeviceName,
            [in] ICHGISPlotLayout        *pPlotLayout
                        );
```

9.3.3 Arguments:

| bstrDeviceName | [in] | BSTR | Name of the Windows device printer to send the to plot to. |
|---|---|---|---|
| pPlotLayout | [in] | ICHGISPlotLayout | Layout parameters that define the current plot specifications. |

9.3.4 Return:

S_OK is connect is successful
E_FAIL encoded with the following information
- vgisErrPlotDeviceInvalid

10.0 ICHGISPLOTLAYOUT INTERFACE

ICHGISPlotLayout contains detailed information about plotting parameters. It will contain specific information about the look of the output and how it is rendered on the page. Under normal circumstances, it will not be created, but received in collection from the VGIS and modified to meet the needs of the current plot operation.

10.1 LayoutName (PropGet)

10.1.1 Description:
Propget defined on the interface that retrieves the name of the layout. This information is defined on the layout in the GIS and should not be modified.

10.1.2 Prototype:
```
HRESULT get_LayoutName(
                [out, retval] BSTR    *bstrLayoutName
                    );
```

10.1.3 Arguments:

| bstrLayoutName | [out, retval] | BSTR | Name of the layout. |
|---|---|---|---|

10.1.4 Return:
HRESULT

10.2 PageSize (PropGet)

10.2.1 Description:

Propget defined on the interface that retrieves the current page size of the layout. This information is defined on the layout in the GIS and should not be modified.

10.2.2 Prototype:

```
HRESULT get_PageSize(
            [out, retval] BSTR    *bstrPageSize
                      );
```

10.2.3 Arguments:

| bstrPageSize | [out, retval] | BSTR | Page size of the layout. "Height X Width" |
|---|---|---|---|

10.2.4 Return:

S_OK or E_FAIL

10.3 PageOrientation (PropGet and PropPut)

10.3.1 Description:

Propget and Propput defined on the interface that set and get the current orientation of the layout – Landscape or Portrait. This information is initially defined on the layout in the GIS.

Orientation is a value out of the vgisPlotOrientation_e enumerator.

vgisPlotLandscape
vgisPlotPortrait

10.3.2 Prototype:

```
      HRESULT get_PageOrientation(
[out, retval] vgisPlotOrientation_e *enumPageOrientation
                            );
      HRESULT put_PageOrientation(
         [in] vgisPlotOrientation_e *enumPageOrientation
                            );
```

10.3.3 Arguments:

| enumPageOrientation | [in] [out, retval] | vgisPlotOrientation_e | Orientation of the layout. |
|---|---|---|---|

10.3.4 Return:

S_OK or E_FAIL

10.4 ViewPortBounds (PropGet)

10.4.1 Description:

Propget defined on the interface that gets the current bounds of the main viewport on the layout. This information is defined on the layout in the GIS and should not be modified.

10.4.2 Prototype:

```
HRESULT get_ViewPortBounds(
                [out, retval] IGeometry    **ppVPortBounds
                    );
```

10.4.3 Arguments:

| pVPortBounds | [out, retval] | IGeometry | Closed line geometry, in a rectangle or square, that defines the bounds of the layouts main plotting viewport. |
|---|---|---|---|

10.4.4 Return:

HRESULT

10.5 PlotRotation (PropGet and PropPut)

10.5.1 Description:

Propget and Propput defined on the interface that gets and set the current plot rotation angle. When the plot layout is initially received from the GIS, this property will be set to 0. It should be modified upon plotting to the desired plot rotation and supplied in degrees.

10.5.2 Prototype:

```
HRESULT get_PlotRotation(
                [out, retval] double *dblPlotRotation
                );
HRESULT put_PlotRotation(
                [in] double dblPlotRotation
                );
```

10.5.3 Arguments:

| dblPlotRotation | [in] [out, retval] | double | Desired rotation angle ( in degrees ) for the current plot. |
|---|---|---|---|

10.5.4 Return:

HRESULT

10.6 PlotScale (PropGet and PropPut)

10.6.1 Description:

Propget and Propput defined on the interface that get and set the current plot scale. When the plot layout is initially received from the GIS, this property will be set to "Window". It should be modified upon plotting to the desired scale and supplied following format.

"Window"
"Fit"
"1:100"
"1:50"

If the supplied scale is not "Window" of "Fit", then a BSTR in the form of "Numertor:Denomerator" will be expected.

10.6.2 Prototype:

```
HRESULT get_PlotScale(
                [out, retval] BSTR *bstrPlotScale
                );
HRESULT put_PlotScale(
                [in] BSTR bstrPlotScale
                );
```

10.6.3 Arguments:

| bstrPlotScale | [in] [out, retval] | BSTR | Desired drawing scale for the current plot. |

10.6.4 Return:

HRESULT

10.7 TitleBlockData (PropGet and PropPut)

10.7.1 Description:

Propget and Propput defined on the interface that gets and sets the current title block data – information displayed in the border such as designer name, draw data, scale, etc. When the plot layout is initially received from the GIS, this property will be an empty recordset with fields appended to it that define the available title block data for the layout. When sending the layout, a row should be added that include the information to display in the border.

10.7.2 Prototype:

```
HRESULT get_TitleBlockData(
            [out, retval] _Recordset **ppTitleBlockData
                    );
HRESULT put_TitleBlockData(
            [in] _Recordset *pTitleBlockData
                    );
```

10.7.3 Arguments:

| pTitleBLockData | [in] [out, retval] | _Recordset | Recordset containing the available field to be populated in the title block |
|---|---|---|---|

10.7.4 Return:

HRESULT

10.8 PlotBounds (PropGet and PropPut)

10.8.1 Description:

Propget and PropPut defined on the interface that get the current plot window bounds. Initially, this will return a geometry equal to the ViewportBounds but can be scaled appropriately. It should always remain proportionate to the viewport bound, hence only proportionate scaling operations should take place on this geometry.

10.8.2 Prototype:

```
HRESULT get_PlotBounds(
                [out, retval] IGeometry    **ppPlotBounds
                );
HRESULT put_PlotBounds(
                [in] IGeometry   *pPlotBounds
                );
```

10.8.3 Arguments:

| pPlotBounds | [in]<br>[out, retval] | IGeometry | Window bounds that define the current plot area.. |
|---|---|---|---|

10.8.4 Return:

HRESULT

11.0 _ICHGISEVENTS INTERFACE

11.1 GisActiveViewChanged

11.1.1 Description:

Fires an event to all registered event sinks that a component of the active view has changed.

The first parameter is the event being broadcast from the GIS. Possible events are:

```
evntTrailPointPlace
evntTrailPointRemove
evntFeatureSelect
evntFeatureUnselect
```

The second parameter is data associated to event, passed as an IUnknown in a VARIANT. Association are as follows:

```
vgisEvntTrailPointPlace  - GeoCoordinate
vgisEvntTrailPointRemove - GeoCoordinate
vgisEvntFeatureSelect   - _Recordset (Feature Definition Structure)
vgisEvntFeatureUnselect - _Recordset (Feature Definition
Structure)
```

11.1.2 Prototype:

```
VOID Fire_GisActiveViewChanged(
                [in] long lEvent,
                [in] VARIANT varData
                );
```

11.1.3 Arguments:

| lEvent | [in] | long | Event of current change in the GIS active view. |
|---|---|---|---|
| varData | [in] | VARIANT | Data associated to the event from the GIS. |

11.1.4 Return:
VOID

11.2 GisDatabaseChanged

11.2.1 Description:

Fires an event to all registered event sinks that a component of the GIS database has changed. Database changes are only fired when changes are made from the GIS.

The first parameter is the event being broadcast from the GIS. Possible events are:

```
vgisEvntRecordInsert
vgisEvntRecordUpdate
vgisEvntRecordDelete
vgisEvntDatabaseCommit
vgisEvntDatabaseRollback
vgisEvntDatabaseUndo
vgisEvntDatabaseRedo
```

11.2.2 Prototype:

```
VOID Fire_GisDatabaseChanged(
                    [in] long lEvent,
                    [in] _Recordset* pFeature
                    );
```

11.2.3 Arguments:

| lEvent | [in] | long | Event of current change in the GIS active view. |
|---|---|---|---|
| pFeature | [in] | _Recordset | Feature Definition Structure that contains the modified feature. |

11.2.4 Return:

VOID

11.3 GisModelChanged

11.3.1 Description:

Fires an event to all registered event sinks that a component of the GIS model has changed. Model changes are only fired when changes are made from the GIS.

The first parameter is the event being broadcast from the GIS. Possible events are:

```
vgisEvntGeometryInsert
```

```
vgisEvntGeometryUpdate
vgisEvntGeometryDelete
```

11.3.2 Prototype:

```
VOID Fire_GisModelChanged(
                    [in] long lEvent,
                    [in] _Recordset* pFeature
                    );
```

11.3.3 Arguments:

| lEvent | [in] | long | Event of current change in the GIS active view. |
|---|---|---|---|
| pFeature | [in] | _Recordset | Feature Definition Structure that contains the modified feature. |

11.3.4 Return:

VOID

HRESULT TYPES

12.1 vgisErrors_e

- vgisErrPlotDeviceInvalid
- vgisErrNoDatabase
- vgisErrNoTable
- vgisErrShapeCompatibility
- vgisErrConstraintViolation
- vgisErrInternal
- vgisErrWkspNameInvalid
- vgisErrWkspCurrentUpdated
- vgisErrWkspAlreadyOpen

12.2 vgisAttachType_e

- vgisTypeALL
- vgisTypePOINT
- vgisTypeLINE

12.3 vgisColor_e

- vgisColorRED
- vgisColorGREEN
- vgisColorBLUE

- vgisColorBLACK
- vgisColorGRAY

12.4 vgisLineStyle_e

- vgisStyleTHICKDASH
- vgisStyleTHICKSOLID
- vgisStyleTHINDASH
- vgisStyleTHINSOLID

12.5 vgisActiveViewEvent_e

- evntTrailPointPlace
- evntTrailPointRemove
- evntFeatureSelect
- evntFeatureUnselect

12.6 vgisDatabaseEvent_e

- vgisEvntRecordInsert
- vgisEvntRecordUpdate
- vgisEvntRecordDelete
- vgisEvntDatabaseCommit
- vgisEvntDatabaseRollback
- vgisEvntDatabaseUndo
- vgisEvntDatabaseRedo

12.7 vgisModelEvent_e

- vgisEvntGeometryInsert
- vgisEvntGeometryUpdate
- vgisEvntGeometryDelete

12.8 vgisPlotOrientation_e

- vgisPlotLandscape
- vgisPlotPortriat

13.0 VTABLE METHOD ORDER

Methods of the interface must be in the vtable in the order specified below.

13.1 ICHGISActiveView

| Position | Method Name |
|---|---|
| 1 | GetActivePoints |
| 2 | ClearActivePoints |
| 3 | HighlightFeature |
| 4 | ClearSelectedFeatures |
| 5 | GetSelectedFeatures |
| 6 | PanToCoord |
| 7 | PanToFeature |
| 8 | DrawOn |
| 9 | PanToGeometry |
| 10 | OffsetPathAlongFeature |

13.2 ICHGISDatabase

| Position | Method Name |
|---|---|
| 1 | InitGIS |
| 2 | CreateRecord |
| 3 | DeleteRecord |
| 4 | UpdateRecord |
| 5 | GetRecords |
| 6 | GetShapeOfTable |

13.3 ICHGISModel

| Position | Method Name |
|---|---|
| 1 | CreateFeature |
| 2 | DeleteFeature |
| 3 | GetFeaturesAtCoord |
| 4 | MoveGeometry |
| 5 | AddGeometry |

13.4 ICHGISTopology

| Position | Method Name |
|---|---|
| 1 | FlowConnectUpstream |
| 2 | FlowConnectDownstream |
| 3 | FlowConnectFeature |
| 4 | FlowDisconnectFeature |
| 5 | FlowDisconnectAll |
| 6 | GetUpstreamFlowConnections |
| 7 | GetDownstreamFlowConnections |
| 8 | GetAllFlowConnections |
| 9 | AddDependentAttachments |
| 10 | RemoveDependentAttachments |
| 11 | GetDependentAttachments |
| 12 | TraceNetwork |
| 13 | ModelNetworkFromTrace |
| 14 | ModelNetworkFromBounds |

13.5 ICHGISWorkspace

| Position | Method Name |
|---|---|
| 1 | Open |
| 2 | Close |
| 3 | Publish |
| 4 | Subscribe |
| 5 | MakeWritable |
| 6 | MakeReadonly |
| 7 | IsWriteable |
| 8 | StartUndoTransaction |
| 9 | EndUndoTransaction |
| 10 | UndoTransaction |
| 11 | RedoTransaction |
| 12 | Commit |
| 13 | Rollback |
| 14 | GetTablesInDatabase |
| 15 | GetDatabaseNames |

13.6 ICHGISPlot

| Position | Method Name |
|---|---|
| 1 | GetAvailableLayouts |
| 2 | Preview |
| 3 | Plot |

13.7 _ICHGISEvents

| Position | Method Name |
|---|---|
| 1 | GisActiveViewChanged |
| 2 | GisDatabaseChanged |
| 3 | GisModelChanged |

APPENDIX B

Expert Designer

Version 3.0

*VIRTUAL WMS*

APPLICATION PROGRAMMING INTERFACE (API)

Version 0.2

*JANUARY 4, 2000*

*A technical specification for software implementation.*

1.0 INTRODUCTION

1.1 Purpose and Scope

Specify the detailed programming interface for the Virtual WMS (VWMS) layer. Includes the identification of all COM interfaces and services, complete with typed parameter information and function prototypes for each service. Initial scoping for the VWMS only includes Severn Trent's STORMS so some preliminary investigation into the interface tables and how they are used has been included.

1.2 Functional Overview

Virtual WMS is a collection of services intended to provide isolation form specific Work Management System implementations. The services are provided as a set of COM interfaces:

1.3 Definition Status

Initial definition of interface methods, with the exception of methods that retrieve and submit as-built information. Additional questions remain is reference to STORMS interface tables.

1.4

2.0 ICHVIRTUALWMS

2.1 RetrieveWrInitiations

2.1.1 Description:

Retrieves works requests that have been initiated in the work management system. A parameter is provided to supply a specific user name. If this parameter is supplied as 'ALL', then all work requests will be retrieved, otherwise, only work requests assigned to the supplied user will be returned. The returned value is a collection of valid work requests interface pointers that can be manipulated as needed.

2.1.2 Prototype:

```
HRESULT RetrieveWrInitiations(
                [in] BSTR bstrUserName,
                [out, retval] ICHWorkRequests* *ppWorkRequests
                    );
```

2.1.3 Arguments:

| bstrUserName | [in] | BSTR | Specifies a user name to retrieve work requests for. Can be supplied as 'ALL' in which case all work requests will be retrieved. |
|---|---|---|---|
| ppWorkRequests | [out, retval] | ICHWorkRequests | Collection of valid work requests that were retrieved from the work management system |

2.1.4 Return:

HRESULT
- S_OK if retrieve succeeded
- E_FAIL if retrieve failed

2.2 RetrieveWrCancellations

2.2.1 Description:

Returns a collection of work requests that were marked as cancelled in the work management system.

2.2.2 Prototype:

```
HRESULT RetrieveWrCancellations(
                    [out, retval] ICHWorkRequests **ppWorkRequests,
                    );
```

2.2.3 Arguments:

| ppWorkRequests | [out, retval] | ICHWorkRequests | A collection of valid work requests that have been cancelled in the work management system. |

2.2.4 Return:

HRESULT
- S_OK if retrieve succeeded
- E_FAIL if retrieve failed

2.3 RetrieveWrCompletions

2.3.1 Description:
Returns a collection of work requests that were marked as construction complete in the work management system.

2.3.2 Prototype:
```
HRESULT RetrieveWrCompletion(
                    [out, retval] ICHWorkRequests **ppWorkRequests,
                    );
```

2.3.3 Arguments:

| ppWorkRequests | [out, retval] | ICHWorkRequests | A collection of valid work requests that have been completed in the work management system. |

2.3.4 Return:
HRESULT
- S_OK if retrieve succeeded
- E_FAIL if retrieve failed

2.4 RetrieveDesignEstimates

2.4.1 Description:

Retrieves estimates from the work management system for the supplied designs. A collection of designs should be supplied and the cost fields will be updated before they are returned. If the cost is not available, the corresponding cost values in the design will be set to NULL_DOUBLE.

2.4.2 Prototype:

```
HRESULT RetrieveDesignEstimates(
                [in, out] ICHDesigns **ppDesigns,
                );
```

2.4.3 Arguments:

| ppDesigns | [in, out] | ICHDesigns | A collection of designs to retrieve costs for. The cost data members of the design pointers will be updated with values from the WMS |

2.4.4 Return:

HRESULT
- S_OK if retrieve succeeded
- E_FAIL if retrieve failed

2.5 RetrieveDesignApprovals

2.5.1 Description:

Retrieves approval status from the work management system for the supplied designs. A collection of designs can be supplied and the status fields will be updated before they are returned.

2.5.2 Prototype:

```
HRESULT RetrieveDesignApprovals(
                    [in, out] ICHDesigns **ppDesigns,
                    );
```

2.5.3 Arguments:

| ppDesigns | [in, out] | ICHDesigns | A collection of designs to retrieve approvals for. The status data member of the design pointers will be updated with values from the WMS |

2.5.4 Return:

HRESULT
- S_OK if retrieve succeeded
- E_FAIL if retrieve failed

2.6 RetrieveAsBuiltData

2.6.1 Description:

Not yet defined – see issue 1.4.1

2.6.2 Prototype:

```
HRESULT RetrieveAsBuiltData();
```

2.6.3 Arguments:

|  |  |  |  |
|--|--|--|--|
|  |  |  |  |

2.6.4 Return:

HRESULT
- S_OK if retrieve succeeded
- E_FAIL if retrieve failed

2.7 RetrieveWrUpdates

2.7.1 Description:
Retrieves updated work request information from the work management system.

2.7.2 Prototype:
```
HRESULT RetrieveWrUpdates(
        [out, retval] ICHWorkRequests **ppWorkRequests
                                );
```

2.7.3 Arguments:

| ppWorkRequests | [out, retval] | ICHWorkRequests | A collection a work requests from the work management system that have updated attributes. |
|---|---|---|---|

2.7.4 Return:
HRESULT
- S_OK if retrieve succeeded
- E_FAIL if retrieve failed

2.8 RetrieveUnitUpdates

2.8.1 Description:

Retrieves updated unit information from the work management system.

*Note: Specifies not yet defined – see issue 1.4.2*

2.8.2 Prototype:

```
HRESULT RetrieveUnitUpdates();
```

2.8.3 Arguments:

|  |  |  |  |
|--|--|--|--|
|  |  |  |  |

2.8.4 Return:

HRESULT
- S_OK if retrieve succeeded
- E_FAIL if retrieve failed

2.9 SubmitWrInitiations

2.9.1 Description:

Initiates work requests in the work management system. Provided for cases where a work request has been initiated in Expert Designer and needs to be passed to the work management system for creation.

2.9.2 Prototype:

```
HRESULT SubmitWrInitiations(
                [in] ICHWorkRequests *pWorkRequests
                );
```

2.9.3 Arguments:

| pWorkRequests | [in] | ICHWorkRequests | Collection of work requests that need to be initiated in the work management system. |

2.9.4 Return:

HRESULT
- S_OK if submit succeeded
- E_FAIL if submit failed

2.10 SubmitDesignData

2.10.1 Description:

Submits design data, such as point information, feature information and unit information, to the work management system. Designs are supplied in a collection so multiple designs can be submitted at once.

2.10.2 Prototype:

```
HRESULT SubmitDesignData(
                [in] ICHDesigns *pDesigns
                     );
```

2.10.3 Arguments:

| pDesigns | [in] | ICHDesigns | Collection of designs that need to be submitted to the work management system |

2.10.4 Return:

HRESULT
- S_OK if submit succeeded
- E_FAIL if submit failed

2.11 SubmitAsBuiltData
2.11.1 Description:
Interface not yet fully defined – see Issue 1.4.1
2.11.2 Prototype:
```
HRESULT SubmitAsBuiltData();
```
2.11.3 Arguments:
2.11.4 Return:
HRESULT
- S_OK if submit succeeded
- E_FAIL if submit failed

2.12 SubmitWrCancellations

2.12.1 Description:
Submits work request cancellations to the work management system.

2.12.2 Prototype:
```
HRESULT SubmitWrCancellations(
                [out, retval] ICHWorkRequests *pWorkRequests,
                );
```

2.12.3 Arguments:

| pWorkRequests | [out, retval] | ICHWorkRequests | A collection of valid work requests that need to be marked as cancelled in the work management system. |
|---|---|---|---|

2.12.4 Return:
HRESULT
- S_OK if submit succeeded
- E_FAIL if submit failed

2.13 SubmitWrCompletions

2.13.1 Description:
Submits work request completions to the work management system.

2.13.2 Prototype:
```
HRESULT SubmitWrCompletions(
                    [out, retval] ICHWorkRequests *pWorkRequests,
                );
```

2.13.3 Arguments:

| pWorkRequests | [out, retval] | ICHWorkRequests | A collection of valid work requests that need to be marked as complete in the work management system. |

2.13.4 Return:
HRESULT
- S_OK if submit succeeded
- E_FAIL if submit failed

2.14 SubmitDesignApprovals

2.14.1 Description:
Submits design approvals to the work management system.

2.14.2 Prototype:
```
HRESULT SubmitDesignApprovals(
                [in] ICHDesigns *pDesigns);
```

2.14.3 Arguments:

| pDesigns | [in] | ICHDesigns | A collection of designs that need to be updated as approved in the work management system. |

2.14.4 Return:
HRESULT
- S_OK if submit succeeded
- E_FAIL if submit failed

2.15 SubmitWrUpdates

2.15.1 Description:

Submits work request updates, such as address or customer information changes, to the work management system.

2.15.2 Prototype:

```
HRESULT SubmitWrUpdates(
                    [in] ICHWorkRequests *pWorkRequests);
```

2.15.3 Arguments:

| pWorkRequests | [in] | ICHWorkRequests | A collection of work requests that have attributes that need to be updates in the work management system. |

2.15.4 Return:

HRESULT
- S_OK if submit succeeded
- E_FAIL if submit failed

2.16 SubmitWrStateChange

2.16.1 Description:

Submits general state changes to the work management. A pointer to the work request is supplied and the current state of that work request will be submitted to the work management system.

2.16.2 Prototype:

```
HRESULT SubmitWrStateChange(
                [in] ICHWorkRequest *pWorkRequest
                        );
```

2.16.3 Arguments:

| pWorkRequest | [in] | ICHWorkRequest | Pointer to a work request whose state changes need to be submitted to the WMS. |

2.16.4 Return:

HRESULT
- S_OK if submit succeeded
- E_FAIL if submit failed

3.0 STORMS VIRTUAL WMS

3.1 Retrieving Work Requests

The following tables will be accessed when retrieving work requests from STORMS:

- TWMWR – System table that holds initiated work requests. When a new record is inserted into this table, a trigger inserts data into TWMIFEXTWRDETAILS for external systems to access. Need to check this table to see if the work request exists before retrieving work request. If the work request is retrieved, keep the ind_util (job type) and id_oper (assigned designer id) field values for later use.
- TWMIFEXTWRDETAILS – External interface table that holds details about work requests initiated in STORMS. Rows should be deleted from this table after they have been successfully processed by the STORMS VWMS. These details will be use to create the work requests. The rows in this table should be deleted after that are successfully processed.
- TWMIFSTATUSCHANGE – Interface table that contains information about work request status changes. Will need to check this table for each work request in TWMIFEXTWRDETAILS before retrieving to see if a record for the work request exists and if it does exist its cd_status does not include an "X". If so, then the work request should not be retrieved

3.2 Retrieving Work Request Status Changes

The following tables will be accessed when retrieving work request status changes from STORMS. These note apply to design approvals, work request completions, and work request cancellations.

- TWMIFSTATUSCHANGE – External interface that holds information about work request status changes.

WR Cancellation – Second character of the cd_status field is "X"

- TWMIFRQMTCHANGE – External interface that holds information about work request requirement changes.

WR Construction Complete - cd_rqmt = 68 and st_rqmt = "C"

- TWMIFEXTWRDETAILS – External interface table that holds details about work requests initiated in STORMS.

Approved - STORMS refers a design approval as locked down. This is indicated in the TWMIFEXTWRDETAILS with an fg_locked_down value of "Y"

*Question: What other cd_rqmt and st_rqmt codes should we be aware of.*

3.3 Submitting Design and AsBuilt Data

The following tables will be accessed when submitting design and asbuilt data to STORMS:

- TWMIFEXTDSGN_PT – External interface table that contains work point data for the design.
- TWMIFEXTDSGN_CU – External interface table that contains CU data for the design. When processing design CU information, make sure that a similar CU (same cu_id, action, etc.) does not already exist at a given work point – if it does, update the qt_action field instead of inserting a new record.
- TWMIFEXTDSGN_ADD – External interface table that contains additional cost items for a design.
- TWMIFEXTDSGN_FAC – External interface table that contains facility attribute information about a design. A new row should be written to this table for each operational attribute specified on the facility.
- TWMIFEXTDSGN_APPL – External interface table that contains application dependencies for design units.
- TWMIFEXTDSGN_TGR – External interface table that, when written to, fires a trigger to process a design data into system tables. The field ind_design_type indicates if the design data has been submitted for "E"stimate or As-"B"uilt.
- TWMIFEXTDSGN_ERR – External interface table that contains errors from design submits.

3.4 Submitting Work Request Updates

The following tables will be accessed when submitting work request updates to STORMS:

- TWMIFMOB_HDR – Interface table that allows external systems to supply work request updates to STORMS.

3.5 Retrieving Unit Updates

The following tables will be accessed when retrieving unit updates from STORMS:

- TWMIFCUDOWNLOAD – Interface table that contains information about cu updates.
- TWMIFCUSTRUCTURE – Interface table that contains information about unit structure changes, associations between units.
- TWMIFCUUSAGE – Interface table that contains information about updates to cu usages.
- TWMIFMATLITEM – Interface table that contains information about updates to material items
- TWMIFATTRIBUTE – Interface table that contains information about attribute updates.

- TWMIFVALIDATTRIB – Interface table that contains information about updates to valid attributes

What is claimed is:

1. An expert designer system for use with a plurality of database system types comprising:

an expert designer system core;

a database system, the database system conforming to at least one of the plurality of database system types, wherein the expert designer system core functions independently of the database type, the database system includes a native GIS, the native GIS conforming to one of a plurality of GIS types, and the expert designer system core functions independently of the GIS type; and a virtual plug-in interface, the virtual plug-in interface communicating with the expert designer system core and the virtual plug-in interface communicating with the database system, wherein the virtual plug-in interface includes a virtual GIS plug-in interface, the virtual GIS plug-in interface communicating with the expert designer system core and the virtual GIS plug-in interface communicating with the native GIS, and the virtual GIS plug-in interface includes at least one of the following:

a GIS modeling interface, a GIS database interface, a GIS workspace interface, a GIS events interface, a GIS topology interface, a GIS active view interface, and a GIS plot interface.

2. The expert designer system of claim 1, wherein the GIS modeling interface includes at least one of the following: a create feature module, a delete feature module, a get features at coordinate module, a move geometry module, an add geometry module, and a get feature geometry module.

3. The expert designer system of claim 1, wherein the GIS database interface includes at least one of the following: a connect to native GIS module, a get records module, a delete records module, an update records module, a create records module, and a get shape of table module.

4. The expert designer system of claim 1, wherein the GIS workspace interface includes at least one of the following: an open module, a close module, a publish module, a subscribe module, a make writable module, a make read-only module, an is writable module, a start undo transaction module, an end undo transaction module, an undo transaction module, a redo transaction module, a commit module, a rollback module, a get database names module, and a get tables in database module.

5. The expert designer system of claim 1, wherein the GIS events interface includes at least one of the following: an active view changed module, a database changed module, and a model changed module.

6. The expert designer system of claim 1, wherein the GIS topology interface includes at least one of the following: an flow connect upstream module, a flow connect downstream module, a flow connect features module, a flow disconnect feature module, a flow disconnect all module, a get upstream flow connections module, a get downstream flow connections module, a get all flow connections module, an add dependent attachment module, a remove dependent attachment module, a remove dependent attachment module, a get dependent attachments module, a trace network module, a module network from trace module, and a model network from bounds module.

7. The expert designer system of claim 1, wherein the GIS active view interface includes at least one of the following: a pan to feature module, a pan to coordinate module, a get active path module, a get active points module, a clear active points module, a highlight feature module, a clear selected feature module, a get selected feature module, and a draw on module.

8. The expert designer system of claim 1, wherein the GIS plot interface includes at least one of the following: a get available layouts module, a preview module, and a plot module.

9. An expert designer system for use with a plurality of utility database system types comprising:

an expert designer system core;

a database system, the database system conforming to at least one of the plurality of utility database system types, wherein the database system includes a native GIS, the native GIS conforming to one of a plurality of GIS types, the native GIS includes a native GIS core and a native GIS database, the expert designer system core functions independently of the database type, and the expert designer system core functions independently of the GIS type; and a virtual plug-in interface, the virtual plug-in interface communicating with the expert designer system core and the virtual plug-in interface communicating with the database system, the virtual plug-in interface including a virtual IGS plug-in interface, the virtual GIS plug-in interface communicating with the native GIS; wherein the virtual GIS plug-in interface includes at least one of the following: a GIS modeling interface, a GIS database interface, a GIS workspace interface, a GIS events interface, a GIS topology interface, a GIS active view interface, and a GIS plot interface.

10. The expert designer system of claim 9, wherein the GIS modeling interface includes at least one of the following: a create feature module, a delete feature module, a get features at coordinate module, a move geometry module, an add geometry module, and a get feature geometry module.

11. The expert designer system of claim 9, wherein the GIS database interface includes at least one of the following: a connect to native GIS module, a get records module, a delete records module, an update records module, a create records module, and a get shape of table module.

12. The expert designer system of claim 9, wherein the GIS workspace interface includes at least one of the following: an open module, a close module, a publish module, a subscribe module, a make writable module, a make read-only module, an is writable module, a start undo transaction module, an end undo transaction module, an undo transaction module, a redo transaction module, a commit module, a rollback module, a get database names module, and a get tables in database module.

13. The expert designer system of claim 9, wherein the GIS events interface includes at least one of the following: an active view changed module, a database changed module, and a model changed module.

14. The expert designer system of claim 9, wherein the GIS topology interface includes at least one of the following: an flow connect upstream module, a flow connect downstream module, a flow connect features module, a flow disconnect feature module, a flow disconnect all module, a get upstream flow connections module, a get downstream flow connections module, a get all flow connections module, an add dependent attachment module, a remove dependent attachment module, a remove dependent attachment module, a get dependent attachments module, a trace network module, a module network from trace module, and a model network from bounds module.

15. The expert designer system of claim 9, wherein the GIS active view interface includes at least one of the following: a pan to feature module, a pan to coordinate module, a get active path module, a get active points module, a clear active points module, a highlight feature module, a clear selected feature module, a get selected feature module, and a draw on module.

16. The expert designer system of claim 9, wherein the GIS plot interface includes at least one of the following: a get available layouts module, a preview module, and a plot module.

* * * * *